(12) United States Patent
Watanabe et al.

(10) Patent No.: US 6,988,399 B1
(45) Date of Patent: Jan. 24, 2006

(54) PHYSICAL QUANTITY DETECTING DEVICE HAVING SECOND LEAD CONDUCTORS CONNECTED TO THE ELECTRODES AND EXTENDING TO THE CIRCUMFERENCE OF THE SUBSTRATE

(75) Inventors: Izumi Watanabe, Hitachinaka (JP); Keiichi Nakada, Hitachinaka (JP); Masamichi Yamada, Hitachinaka (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/763,970

(22) PCT Filed: May 2, 2000

(86) PCT No.: PCT/JP00/02910

§ 371 (c)(1),
(2), (4) Date: Feb. 28, 2001

(87) PCT Pub. No.: WO01/84088

PCT Pub. Date: Nov. 8, 2001

(51) Int. Cl.
*G01F 1/68* (2006.01)

(52) U.S. Cl. .................................. 73/204.26
(58) Field of Classification Search ............. 73/204.26, 73/204.25
See application file for complete search history.

(56) References Cited

U.S. PATENT DOCUMENTS

| | | | |
|---|---|---|---|
| 4,841,769 A | * | 6/1989 | Porth et al. ............... 73/204.26 |
| 5,061,350 A | | 10/1991 | Ishiguro et al. ............ 204/37.1 |
| 5,243,858 A | * | 9/1993 | Erskine et al. ............ 73/204.26 |
| 5,708,205 A | * | 1/1998 | Yamada et al. ........... 73/204.26 |
| 6,553,829 B1 | * | 4/2003 | Nakada et al. ............ 73/204.26 |
| 6,708,560 B2 | * | 3/2004 | Watanabe et al. ......... 73/204.22 |

FOREIGN PATENT DOCUMENTS

| | | |
|---|---|---|
| DE | 76 29 727 U1 | 12/1976 |
| DE | 196 19 247 A1 | 11/1996 |
| JP | 2-291951 | 12/1990 |
| JP | 8-54269 | 2/1996 |
| JP | 11-83580 | 3/1999 |
| JP | 11-233303 | 8/1999 |

\* cited by examiner

*Primary Examiner*—Harshad Patel
(74) *Attorney, Agent, or Firm*—Crowell & Moring LLP

(57) ABSTRACT

It is an object of the present invention to provide a simple-structure physical quantity detecting device whose resistance does not vary irrespective of use for long periods, a method for manufacturing thereof and a motor vehicle control system using the physical quantity detecting sensor to improve its reliability. An airflow sensor (20) is equipped with a heat generating resistor (12H) and a temperature measuring resistor (12C), formed on a semiconductor substrate (11). The heat generating resistor (12H) is formed in a thin-wall portion (11A). Both end portions of the heat generating resistor (12H) are connected through first lead conductors (13H1, 13H2) to electrodes (14H1, 14H2), respectively. A second lead conductor (15H1) connected to the electrode (14H1) extends to an outer circumferential portion of the airflow sensor (10). A second lead conductor (15H2, 15H3) connected to the electrode (14H2) also extend to the outer circumferential portion of the airflow sensor (10), but a disconnection portion (16) is made in the middle thereof to establish electrical non-conduction.

6 Claims, 21 Drawing Sheets

PHYSICAL QUANTITY DETECTING DEVICE HAVING SECOND LEAD CONDUCTORS CONNECTED TO THE ELECTRODES AND EXTENDING TO THE CIRCUMFERENCE OF THE SUBSTRATE

TECHNICAL FIELD

The present invention relates to a physical quantity detecting device for detecting physical quantities such as flow rate, pressure, temperature, humidity, acceleration and gas concentration, a method for manufacturing a physical quantity detecting device and a motor vehicle control system using the physical quantity detecting device, and more particularly to a physical quantity detecting device, a method for manufacturing a physical quantity detecting device and a motor vehicle control system using the physical quantity detecting device, suitable for use of a small-sized sensor.

BACKGROUND ART

So far, as an airflow sensor placed in an intake air passage of an internal combustion engine or the like for measurement of air quantity, the principal tendency has been toward a thermal type for direct detection of mass air quantity. Recently, particular attention has been focused on a small-sized airflow sensor produced through the use of the semiconductor micromachining technique, for its high response and for its counterflow detection ability using the high response. As heater materials for the conventional small-sized thermal type airflow sensor, as exemplified in JP-A-8-54269 or 11-233303, there has been used a semiconductor material such as polysilicon or a metallic material such as platinum, gold, copper, aluminum, chromium, nickel, tungsten, permalloy (FeNi) or titanium. In addition, as stated in JP-A-11-233303, such a small-sized sensor is applicable not only to the flow rate sensor but also to a relative-humidity detecting sensor or a gas detecting sensor.

There is a problem which arises with the conventional small-sized sensor, however, in that the resistance of the heater resistor itself varies due to the heating of the heater resistor formed on a thin-wall portion or the thermal influence from the surroundings. For this reason, as exemplified in JP-A-11-233303, there has been known a technique in which a conductive film is form independently of the heater resistor to prevent the temperature distribution to local heating, thus suppressing the variations with the passage of time.

DISCLOSURE OF THE INVENTION

However, the type using a conductive film different from the heater resistor creases a problem on complication of the sensor structure.

Accordingly, it is an object of the present invention to provide a simple-structure physical quantity detecting device whose resistance does not vary irrespective of use for long periods, a method for manufacturing thereof and a motor vehicle control system using the physical quantity detecting sensor to improve its reliability.

(1) For achieving the foregoing object, in accordance with the present invention, there is provided a physical quantity detecting device comprising a resistor formed on a thin-wall portion of a substrate and electrodes respectively connected through first lead conductors to both ends of the resistor and made to detect a physical quantity through the use of the resistor, wherein provided are second lead conductors electrically connected to both the ends of the resistor and formed to extend to an outer circumferential end of the substrate.

This arrangement can provide a simple structure without any variation in resistance irrespective of use for long periods.

(2) In addition, for achieving the foregoing object, in accordance with the present invention, there is provided a method for manufacturing a plurality of physical quantity detecting devices each comprising a resistor formed on a thin-wall portion of a substrate and electrodes respectively connected through first lead conductors to both ends of the resistor so that a physical quantity is detected through the use of the resistor, wherein the plurality of resistors are concurrently formed on the substrate and after both ends of each of the plurality of resistors are successively electrically connected through a second lead conductor, the plurality of resistors are simultaneously energized to be heated, and the substrate is divided in units of single resistors.

This arrangement can provide a simple-structure physical quantity detecting device whose resistance does not vary irrespective of use for long periods.

(3) Still additionally, for achieving the foregoing object, in accordance with the present invention, there is provided a motor vehicle control system comprising a physical quantity detecting device and a control unit for controlling a motor vehicle on the basis of a condition of the motor vehicle detected by the physical quantity detecting device, with the physical quantity detecting device being composed of a resistor formed on a thin-wall portion of a substrate and electrodes respectively connected through first lead conductors to both ends of the resistor so that a physical quantity is detected through the use of the resistor, wherein provided is a second lead conductor electrically connected to both ends of the resistor of the physical quantity detecting device and made to extend to an outer circumferential end of the substrate.

This arrangement can enhance the reliability at control.

BEST MODE FOR CARRYING OUT THE INVENTION

Referring to FIGS. 1 to 13, a description will be given hereinbelow of a construction of a physical quantity detecting device according to a first embodiment of the present invention. In the following description, as an example, a thermal type airflow sensor is taken as the physical quantity detecting device.

First, referring to FIGS. 1 to 3, a description will be given of the entire construction of the thermal type airflow sensor forming the physical quantity detecting device according to this embodiment.

Figure 1:
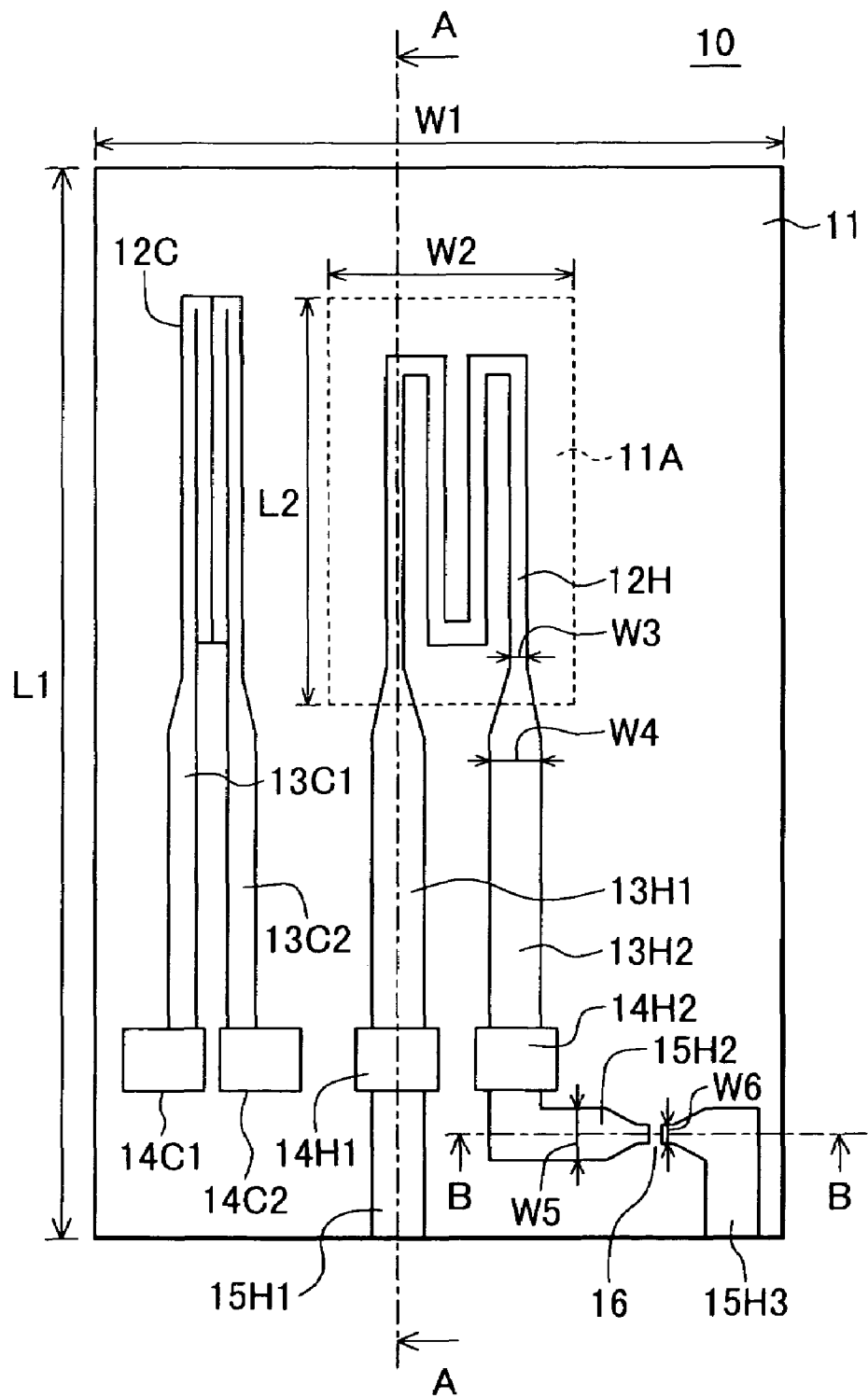
FIG. 1 is a plan view showing a thermal type airflow sensor serving as a physical quantity detecting device according to a first embodiment of the present invention.
Figure 2:
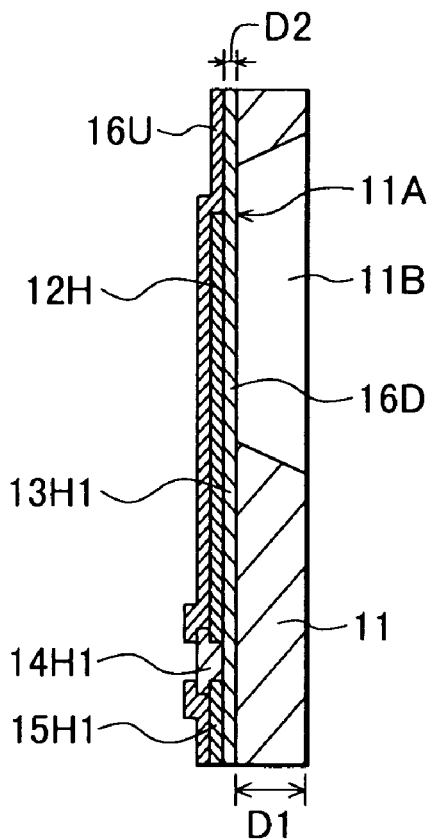
FIG. 2 is a cross-sectional view taken along A—A of FIG. 1.
Figure 3:
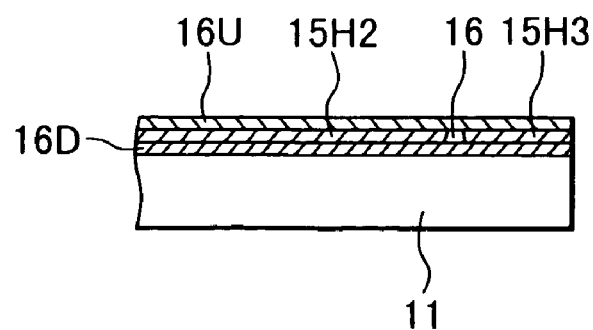
FIG. 3 is a cross-sectional view taken along B—B of FIG. 1.

FIG. 1 is a plan view showing the thermal type airflow sensor serving as the physical quantity detecting device according to the first embodiment of the present invention, FIG. 2 is a cross-sectional view taken along A—A in FIG. 1, and FIG. 3 is a cross-sectional view taken along B—B in FIG. 1.

As FIG. 1 shows, the thermal type airflow sensor 10 comprises a heat generating resistor 12H and a temperature measuring resistor 12C, both formed on a semiconductor substrate 11, with the semiconductor substrate 11 being made of silicon or the like. The heat generating resistor 12H and the temperature measuring resistor 12C are a resistor in which a polysilicon or single-crystal silicone is doped with impurities such as P, alternatively, they are made of platinum, gold, copper, aluminum, chromium, nickel, tungsten, permalloy (FeNi), titanium, or the like. The heat generating resistor 12H is formed on a thin-wall portion 11A. The detailed description of the thin-wall portion 11A will be given later with reference to FIG. 2. Both end portions of the heat generating resistor 12H are connected through first lead conductors 13H1 and 13H2 to electrodes 14H1 and 14H2, respectively. A second lead conductor 15H1 connected to the electrode 14H1 extends to an outer circumferential portion of the airflow sensor 10. Second lead conductors 15H2 and 15H3 connected to the electrode 14H2 also extend to outer circumferential portions of the airflow sensor 10, while a disconnection portion 16 exists therebetween to produce an electrical non-conducting portion.

The semiconductor substrate 11 has a dimension of, for example, a depth W1 of 2.5 mm and a length L1 of 6 mm. The size of the thin-wall portion 11A is such that, for example, a width W2 is 0.5 mm and a length L2 is 1 mm. The heat generating resistor 12H has a width W3 of, for example, 70 $\mu$m, and each of the first lead conductors 13H1 and 13H2 has a width W4 of, for example, 100 $\mu$m. In addition, a width W5 of each of the second lead conductors 15H1 and 15H2 is, for example, 100 $\mu$m, and a width W6 of the disconnection portion 16 is, for example, 2 $\mu$m.

Secondly, referring to FIG. 2, a description will be given of a construction in a cross section taken along A—A of FIG. 1. The same numerals as those in FIG. 1 denote the same parts.

A lower-layer insulating film 16D is formed on the semiconductor substrate 11. On the lower-layer insulating film 16D, there are formed the heat generating resistor 12H, the first lead conductor 13H1, the second lead conductor 15H1 and the electrode 14H1. Moreover, an upper-layer insulating film 16U is formed on the heat generating resistor 12H, the first lead conductor 13H1 and the second lead conductor 15H1 and further on a portion of the electrode 14H1. The lower-layer insulating film 16D and the upper-layer insulating film 16U are made of $SiO_2$ or $Si_3N_4$. That is, the heat generating resistor 12H and the lead conductors 13H1 and 15H1 are interposed between the insulating films. As well as the heat generating resistor 12H, the temperature measuring resistor 12C is also put between the lower-layer insulating film 16D and the upper-layer insulating film 16U.

In addition, a cavity is made in a portion of the semiconductor substrate 11 and on the rear side of a portion of the formation of the heat generating resistor 12H. Accordingly, the semiconductor substrate does not exists under the heat generating resistor 12H, with the heat generating resistor 12H being supported by the thin-wall portion 11A of the lower-layer insulating film 16D. The cavity 11B is made in the rear of the semiconductor substrate 11 by means of anisotropic etching using an etching liquid such as potassium hydroxide.

The thickness D1 of the semiconductor substrate 11 is, for example, 0.3 mm, and the thickness D2 of the lower-layer insulating film providing the thin-wall portion 11A is, for example, 0.0015 mm.

Furthermore, referring to FIG. 3, a description will be given of a configuration in a cross section taken along B—B of FIG. 1. The same numerals as those in FIG. 1 signify the same parts.

The lower-layer insulating film 16D is made in the semiconductor substrate 11. The second lead conductor 15H2 is formed on the lower-layer insulating film 16D. The upper-layer insulating film 16U is formed on the second lead conductor 15H2. The disconnection portion 16 is made in a portion of the second lead conductor 15H2.

In addition, referring to FIGS. 4 and 5, a description will be given hereinbelow of a construction of an airflow meter using a thermal type airflow sensor serving as the physical quantity detecting device according to this embodiment.

Figure 4:
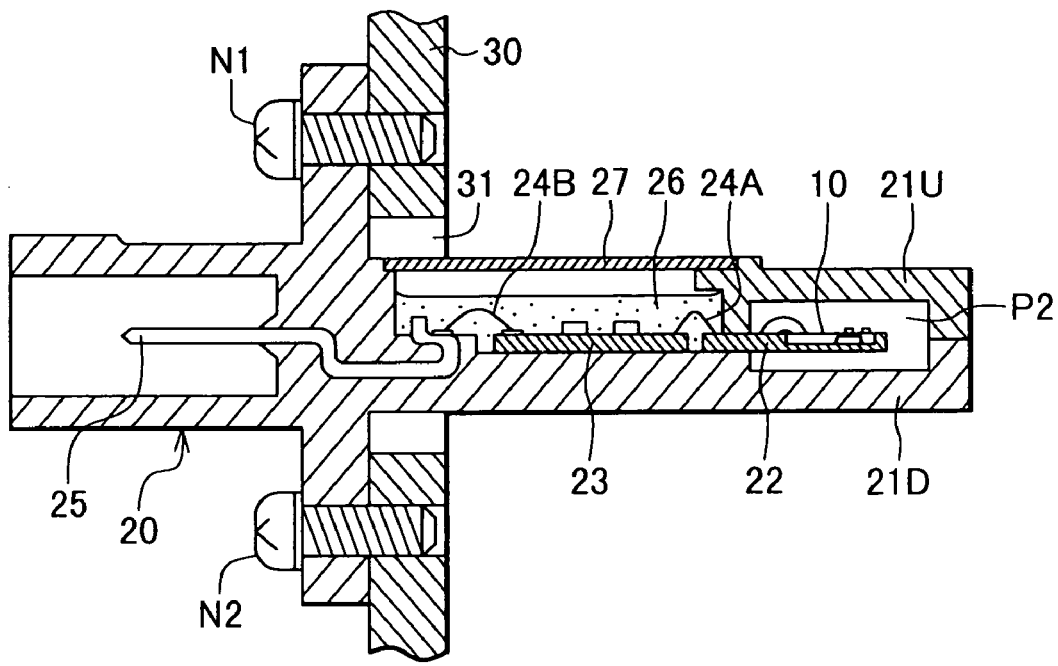
FIG. 4 is a cross-sectional view showing a mounted state of an airflow meter using the thermal type airflow sensor forming the physical quantity detecting device according to the first embodiment of the present invention.
Figure 5:
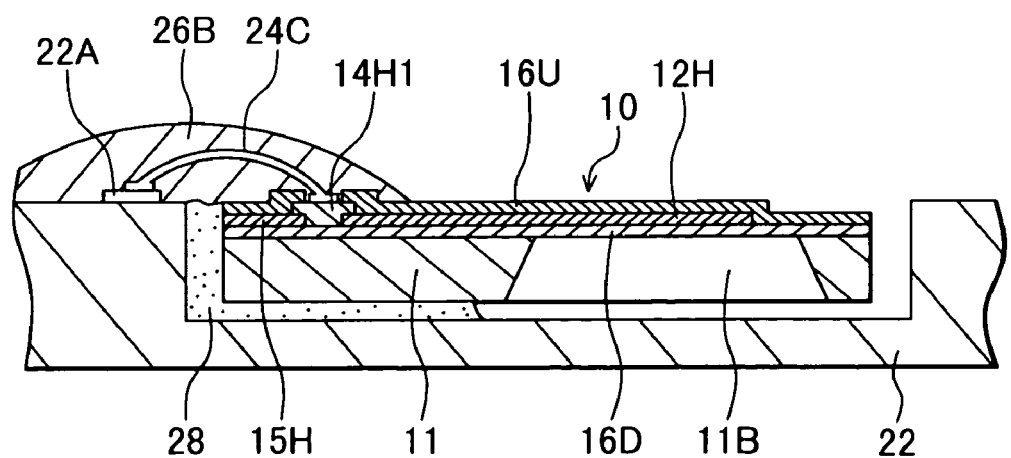
FIG. 5 is an enlarged cross-sectional view showing an essential part in FIG. 4.

FIG. 4 is a cross-sectional view showing a mounted state of the thermal type airflow sensor forming the physical quantity detecting device according to the first embodiment of the present invention, and FIG. 5 is a cross-sectional view showing an essential part of FIG. 4. The same numerals as those in FIGS. 1 and 2 represent the same parts.

As FIG. 4 shows, the tip portion of the airflow meter 20 is put in the interior of an opening 31 made in a wall surface of an intake pipe 30 constituting an intake passage P1 of an internal combustion engine. The airflow meter 20 is fixedly secured through screws N1 and N2 to the intake pipe 30. The airflow meter 20 is equipped with a lower housing 21D and an upper housing 21U. A sub-passage P2 is defined between the lower housing 21D and the upper housing 21U. The sub-passage P2 accepts a portion of air flow passing through the intake passage P1. In the interior of the sub-passage P2, located the thermal type airflow sensor 10 supported by a supporting member 22. In addition, the lower housing 21D contains a control circuit 23. The control circuit 23 and the airflow sensor 10 are electrically connected through a connecting wire 24A to each other. The control circuit 23 includes a circuit for controlling currents flowing in the heat generating resistor of the airflow sensor 10 and a circuit for outputting a signal indicative of an air flow rate detected by the airflow sensor 10. The control circuit 23 is connected through a connecting wire 24B to a metallic terminal 25, so an air flow rate signal is fetched from the metallic terminal 25 to the external. The upper portions of the control circuit 23 and the connecting wires 24A, 24B are covered with a silicon gel 26, which provides a moisture-proof structure for the control circuit 23 and the connecting circuits 24A, 24B. Still additionally, a cover 27 is placed on the control circuit 23.

Moreover, as FIG. 5 shows, the thermal type airflow sensor 10 is fixedly adhered to a hollow made in the supporting member 22 through the use of a sensor adhesive 28 such as a silver paste. The construction of the airflow sensor 10 is similar to that mentioned with reference to FIGS. 1 to 3. The terminal 14H1 of the airflow sensor 10 is connected through a connecting wire 24C to a terminal 22A of the supporting member 22. The connecting wire 24C is covered with a sealing material 26B such as an epoxy resin.

Still additionally, referring to FIGS. 6 and 7, a description will be given hereinbelow of a method for manufacturing the thermal type airflow sensor acting as the physical quantity detecting device according to this embodiment.

Figure 6:
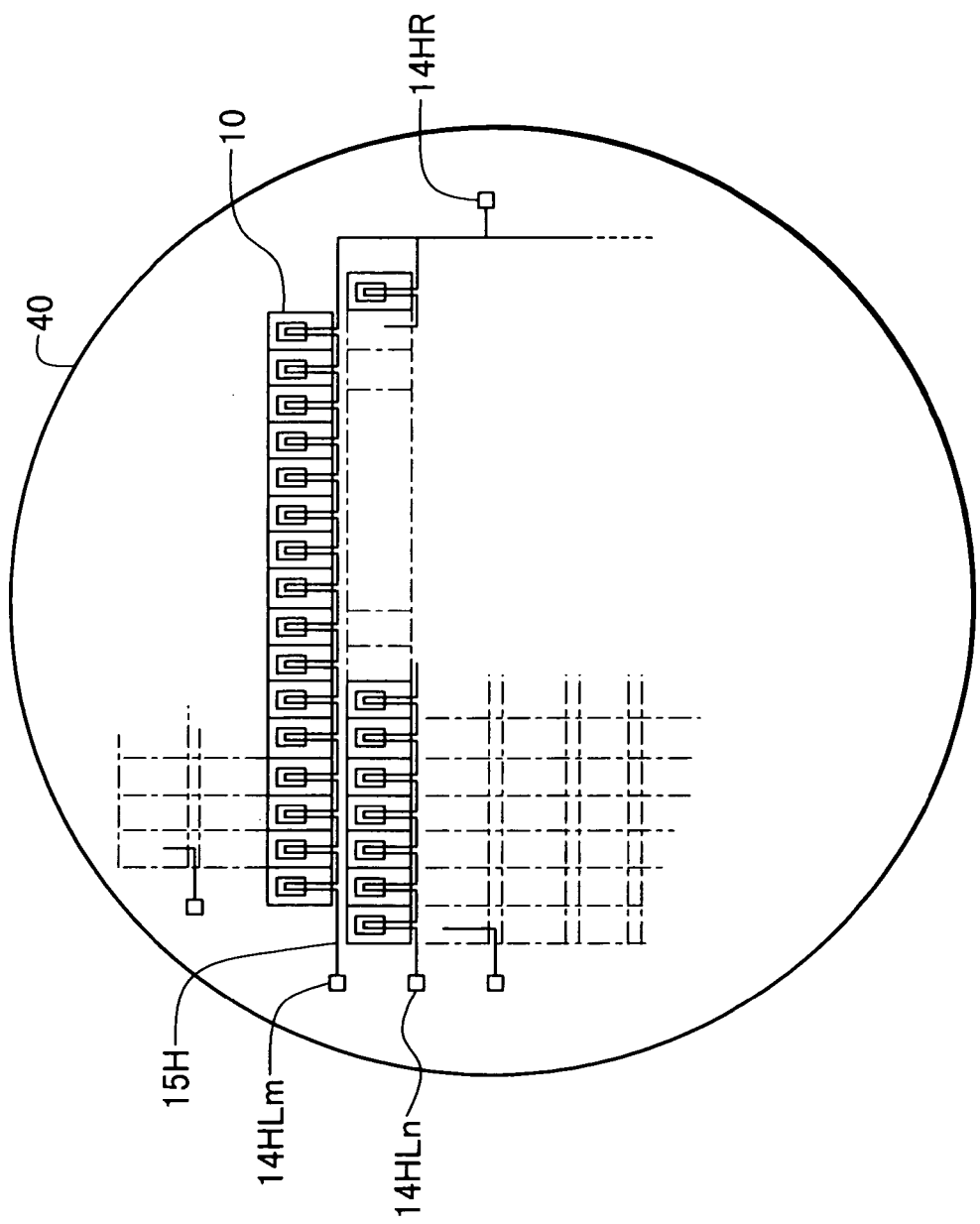
FIG. 6 is a plan view showing the thermal type airflow sensor forming the physical quantity detecting device, at its manufacturing, according to the first embodiment of the present invention.
Figure 7:
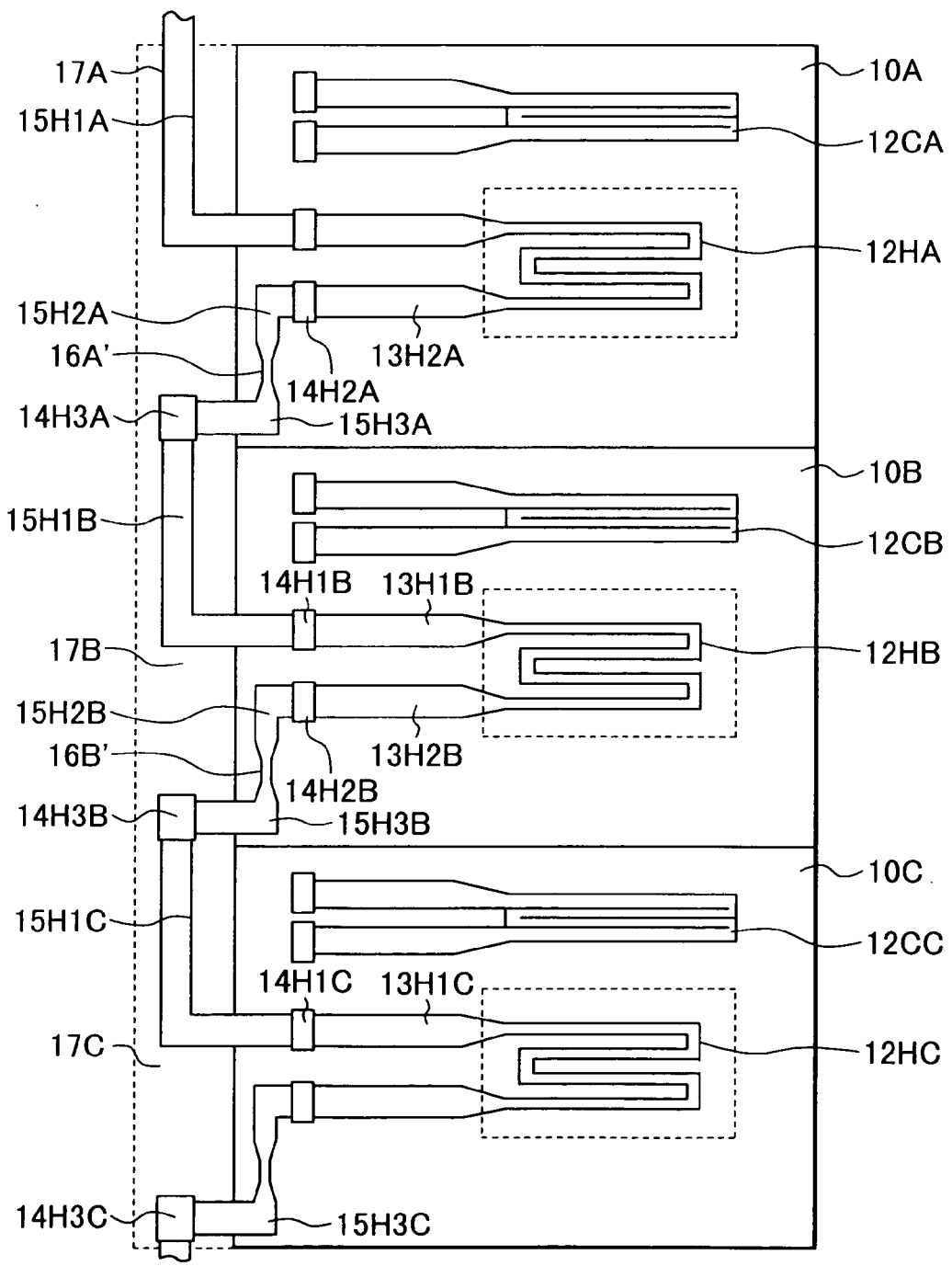
FIG. 7 is an enlarged plan view showing an essential part in FIG. 6.

FIG. 6 is a plan view showing the thermal type airflow sensor acting as the physical quantity detecting device, at its manufacturing, according to the first embodiment of the present invention, and FIG. 7 is an enlarged plan view showing an essential part in FIG. 6.

As FIG. 6 shows, on a semiconductor wafer 40, a plurality of thermal type airflow sensors 10 are produced simultaneously by the semiconductor micromachining technique. In a case in which the semiconductor wafer 40 has a diameter of approximately 12.5 cm (5 inches), the number of airflow sensors 10 to be producible concurrently reaches approximately 600. The airflow sensors 10 are located in a matrix arrangement, and a maximum of 40 sensors 10 are produced on one side thereof.

The construction of the airflow sensor 10 is similar to that mentioned with reference to FIGS. 1 to 3. In a state where a plurality of airflow sensors 10 are formed on the semiconductor wafer 40, the disconnection portion 16 in FIG. 1 does not switch into the disconnecting condition yet, but remains in a conducting condition. In addition, the second lead conductors 15H1, 15H2 and 15H3 in FIG. 1 are electrically connected in series through the second lead conductor 15H. With respect to the airflow sensors 10 arranged in a matrix form, an electrode 14HLm, 14HLn, ßßß is formed at every member on the left side of the airflow sensors connected in series in each member, while an electrode 14HR common to the respective members is formed on the right side of the airflow sensors connected in series in each member.

In this case, the heat generating resistor 12H in FIG. 1 is used in a state heated to assume a temperature higher by approximately 100_C to 150_C than an ambient temperature on the basis of the resistance value of the temperature measuring resistor 12C. Since the ambient temperature increases to approximately 100_C due to the intake air of the motor vehicle, the heat generating resistor 12H is heated up to approximately 200_C. to 250_C. For this reason, it was found that, if the airflow sensor is put to use for a long time, its deterioration grows gradually to cause variations in resistance. In response to the variation in resistance value, the flow rate characteristic of the thermal type airflow sensor 10 varies, with its lowered reliability. Therefore, study was made about an aging treatment to prevent the variation in resistance value during the practical use by energizing and heating the heat generating resistor 12H in advance before use for promotion of its deterioration. The aging treatment is achievable, for example, by supplying a predetermined current to between the electrodes 14H1 and 14H2 shown in FIG. 1. However, it was found that the aging treatment at every airflow sensor creates a problem of a low working efficiency, for that the size of the airflow sensor 10 is as small as 2.5 mm_6 mm and each of the electrodes 14H1 and 14H2 is also shaped into a square whose one side is as small as 100 μm. As will be described later with reference to FIGS. 8 to 13, as the energization condition, the energization time is required to be approximately 24 hours.

Accordingly, in this embodiment, as FIG. 6 shows, of a plurality of (several hundreds of) airflow sensors 10 to be manufactured in a matrix form on the semiconductor wafer 40, the sensors in each member are connected through the second lead conductor 15H, and for an aging treatment, a plurality of heat generating resistors 12H are simultaneously energization-heated in a manner that energization takes place between the electrode 14HLm, 14HLn and the electrode 14HR. For example, as the semiconductor wafer 40, using a wafer having a size of 5 inches, it is possible to form approximately 600 semiconductor sensor elements 10, and further to accomplish the simultaneous energization thereof, which reduces the needed energization time to 1/600.

In addition, as FIG. 2 shows, the thin-wall portion 11A of the semiconductor substrate 11 is easy to break down at the anisotropic etching in the manufacturing process. In particular, in the thermal type airflow sensor 10, since the thin-wall portion 11A has a thickness as thin as 0.0015 mm, even if microscopic cracks develop on a surface of the thin-wall portion 11A, then the airflow sensor 16 itself can break down. For microscopic damages, since difficulty is encountered in checking the airflow sensor 10 individually, troubles becomes obvious after the connection to the control circuit 23 shown in FIG. 4, which leads to a drop of yield at manufacturing.

On the other hand, in this embodiment, by measuring a resistance value between the electrodes 14HLm and 14HR shown in FIG. 6, it is possible to facilitate the inspection as to whether or not damaged sensors exist in a plurality of (for example, forty) airflow sensors 10 connected between the electrodes 14HLm and 14HR. Likewise, the inspection for a plurality of sensors in the other members is possible. Since the probability of the occurrence of broken sensors is not very high, the collective inspection for the absence of broken sensors of the 40 forty sensors allows the inspection operation to be accomplished for a short time. If the inspection has proven that the forty sensors include some broken sensors, the it is possible to specify that broken sensor in a manner that the inspection of the sensors is made individually.

Furthermore, FIG. 7 is an enlarged illustration of portions of three airflow sensors 10A, 10B and 10C of a plurality of airflow sensors 10 formed on the semiconductor wafer 40 shown in FIG. 6. The construction of each of the airflow sensors 10A, 10B and 10C is similar to that shown in FIG. 1. For example, the airflow sensor 10B is equipped with a heat generating resistor 12HB and a temperature measuring resistor 12CB.

Both end portions of the heat generating resistor 12HB are connected through first lead conductors 13H1B and 13H2B to electrodes 14H1B and 14H2B, respectively. A second lead conductor 15H1B connected to the electrode 14H1B is connected to an electrode 14H3A of the airflow sensor 10A. A second lead conductor 15H2B connected to an electrode 14H2B is connected through a narrow section 16B' and a second lead electrode 15H3B to an electrode 14H3B. A heat generating resistor 12HA of the airflow sensor 10A is connected to an electrode 14H3A through a first lead conductor 13H2A, an electrode 14H2A, a second lead conductor 15H2A, a narrow portion 16A' and a second lead conductor 15H3A. In addition, a heat generating resistor 12HC of the airflow sensor 10C is connected to the heat generating resistor 12HB through a first lead conductor 13H1C, an electrode 14H1C and a second lead conductor 15H1C. In this way, the respective heat generating resistors 12HA, 12HB and 12HC are in series connection with each other.

In this case, when the width of each of the second lead conductors 15H2B and 15H3B is set at 100 μm as described with reference to FIG. 1, the width of the narrow portion 16B' is set to be as narrow as approximately 2 μm. In the energization for the aging, the energization current is not very high so that the narrow portion 16B' does not melt. After the completion of the aging treatment, for example, when a large current flows between the electrode 14H2B and the electrode 14H3B, the narrow portion 16B' is heated to melt like a fuse. This large-current energization processing causes electrical non-conduction of the narrow portion 16B, thus establishing the disconnection portion 16 shown in FIG. 1. For example, if the energization current at the aging treatment is set at 10 mA, for the disconnection according to the fusing method using a large current, the energization is made at a large current of approximately 1 A.

Incidentally, as a method for placing the narrow portion 16B' into a disconnecting condition, in addition to the fusing method using a large current, it is also possible to employ, for example, a method for melting a narrow portion through the use of laser light to place it into a disconnecting condition.

In the state shown in FIG. 7, portions denoted at solid lines are for the airflow sensors 10A, 10B and 10C, and when the solid line portions are cut off from the semiconductor wafer, each airflow sensor is producible. On the other hand, the portions 17A, 17B and 17C designated at broken lines are abandoned when the semiconductor wafer 40 is cut to produce the airflow sensors 10A, 10B and 10C. As illustrated, the portions 17A, 17B and 17C to be abandoned include the electrodes 14H3A, 14H3B and 14H3C and further include portions of the second lead conductors 15H1A, 15H1B, 15H1C, 15H3A, 15H3B and 15H3C.

In the airflow sensor 10 produced in this way, the end portions of the second lead conductors 15H1 and 15H3 extend to the edge portion of the semiconductor substrate 11 as shown in FIG. 1. In this case, both the end portions of the heat generating resistor 12H need to be connected to the lead conductors, and this becomes essential in the case of the construction in which, after the series connection of a plurality of heat generating conductors described with reference to FIG. 6, the disconnection between the plurality of heat generating conductors is made using the abandoned portions 17 as described with reference to FIG. 7. In this embodiment, the second lead conductor 15H1 is connected to the heat generating resistor 12H, whereas the second lead conductor 15H3 is not connected to the heat generating resistor 12H, for that the disconnection portion 16 lies halfway.

This construction provides the following advantages. The airflow sensor 10 is fixedly secured through the sensor adhesive 28 to the supporting member 22 as shown in FIG. 4. At this time, when two lead conductors exist at the end portions of the airflow sensor 10, the sensor adhesive 28 can make electrical connection between the two lead conductors.

The connection between the two lead conductors signifies the connection between both the end portions of the heat generating resistor 10, which destroys the sensor function. In addition, although an electrically insulating adhesive is used as the sensor adhesive, since the semiconductor substrates showing an electrical conductivity are put close to each other, the effect of humidity or the mixing of electrically conductive foreign matters can lead to conduction. In addition, when the sensor 11 is cut off from the semiconductor wafer 11 in the manufacturing process, the use of the dicing is common, while electrical conductive silicon or conductor materials appearing as chips at that time can attached to the cut end surfaces, which requires a cleaning process to remove the attachments.

On the other hand, in this embodiment, even if the sensor adhesive makes the connection between the second lead conductor 15H1 and the second lead conductor 15H3, since the second lead conductor 15H3 is in the electrical non-conduction relation to the heat generating resistor 12H at the disconnection portion 16, the sensor function is still maintainable.

Incidentally, in the construction shown in FIG. 1, although the second lead conductors 15H1 and 15H3 are cut at the end surface of the semiconductor substrate 11, it is also acceptable that the electrodes 14H1 and 14H2 are formed at the end surface of the semiconductor substrate 11.

Moreover, referring to FIGS. 8 to 13, a description will be given hereinbelow of an aging treatment, at manufacturing, of a thermal type air flow sensor serving as the physical quantity detecting device according to this embodiment.

First, referring to FIG. 8, a description will be given of the relationship between power consumption and heat generation temperature of the heat generating resistor 12H and temperature measuring resistor 12C for use in the thermal type airflow sensor according to this embodiment.

Figure 8:
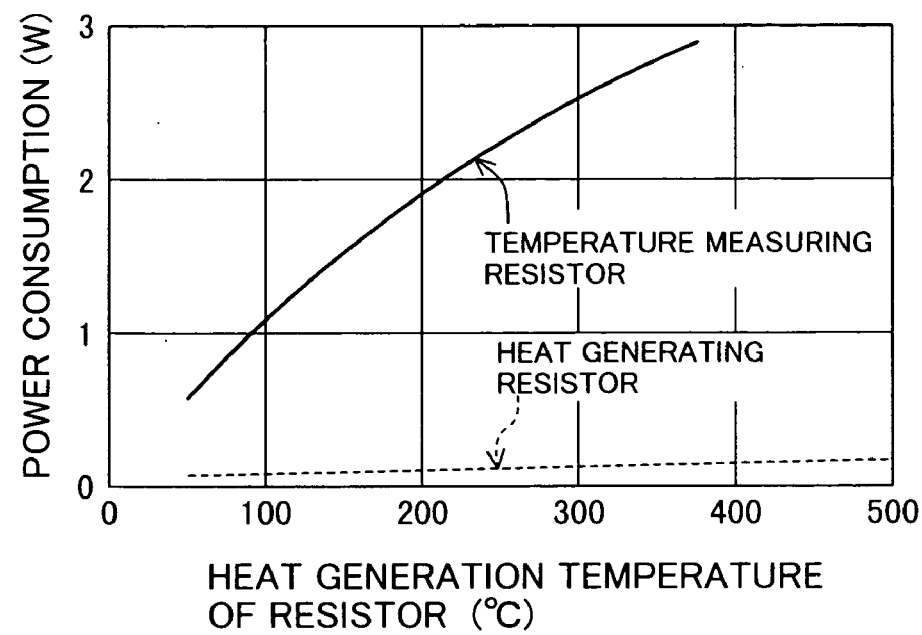
FIG. 8 is an illustration for explaining the relationship between a head generation temperature and power consumption of a temperature-measuring resistor and a heat generating resistor to be used in the thermal type airflow sensor according to the first embodiment of the present invention.

FIG. 8 is an illustration for explaining the relationship between power consumption and heat generation temperature of the heat generating resistor and temperature measuring resistor to be used in the thermal type airflow sensor according to the first embodiment of the present invention. In the illustration, the horizontal axis represents heat generation temperature (° C.) of the resistors 12H and 12C while the vertical axis denotes power consumption (W).

FIG. 8 shows the relationship between the power consumption and the heat generation temperature in the case of employing the heat generating resistor 12H formed on the thin-wall portion 11A of the thermal type airflow sensor 10 and the temperature measuring resistor 12C formed on a portion other than the thin-wall portion and of varying the voltage to be applied at the ordinary temperature and in the windless atmosphere. The power consumption to be taken for heating the heat generating resistor 12H, formed on the thin-wall portion 11A, to, for example, 250° C. through energization is as small as 0.04 W. Meanwhile, the power consumption to be needed for heating the temperature measuring resistor 12C to the same temperature is 2.2 W. Therefore, even in a case in which 600 heat generating resistors 12H are collectively and simultaneously heated to 250° C. before energization, this requires a power supply having a small supply capability of 24 W only.

Conversely, in the case of a resistor formed other than the thin-wall portion 11A as well as the temperature measuring resistor 12C, since head spreads over the entire semiconductor substrate 11 with a high thermal conduction, an extremely large power becomes necessary, which makes it difficult to design the actual facilities. What's more, since the entire semiconductor wafer 40 reaches a high temperature, which deteriorates, for example, the aluminum forming the electrode 14 or the organic insulating film such as polyimide formed on a portion of the surface. In this embodiment, by the energization to only the resistor 12H formed on the thin-wall portion 11A, the ideal aging of only the heat generating resistor 12H becomes possible because heat is hard to propagate in the portions other than the thin-wall portion 11A.

First, referring to FIG. 9, a description will be given of a rate of change of resistance of the heat generating resistor, at energization heating before an aging treatment, for use in the thermal type airflow sensor according to this embodiment.

Figure 9:
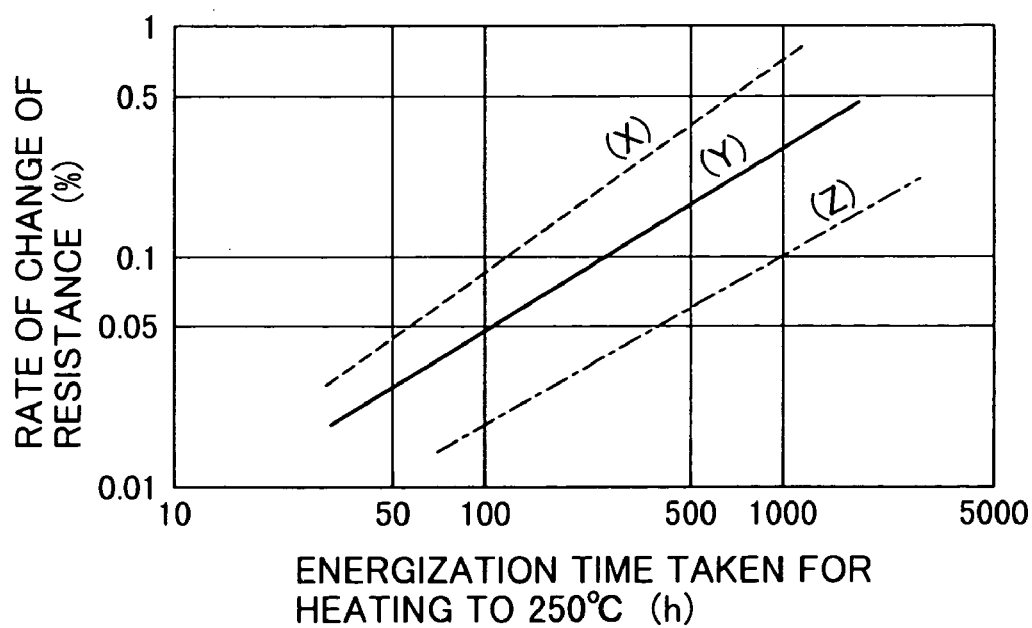
FIG. 9 is an illustration for explaining a rate of change of resistance of a heat generating resistor, at energization heating before an aging treatment, to be used in the thermal type airflow sensor according to the first embodiment of the present invention.

FIG. 9 is an illustration for explaining a rate of change of resistance of a heat generating resistor, at energization heating before an aging treatment, to be used in the thermal type airflow sensor according to the first embodiment of the present invention.

In the illustration, the horizontal axis represents time with a logarithmic scale in the case of energization heating to 250° C., while the vertical axis denotes a rate (%) of change of resistance of the heat generating resistor 12H with a logarithmic scale.

In the illustration, (X) designates the transition of a rate of change of resistance in a case in which a platinum-made thin-film resistor is used as the material for the heat generating resistor 12H. In addition, (Y) depicts the transition of a rate of change of resistance in the case of employment of a resistor in which a single-crystal silicon doped with P (phosphorus) forming impurities is used as the material for the heat generating resistor 12H, and (Z) indicates the transition of a rate of change of resistance of a resistor in which polysilicon doped with P (phosphorus) forming impurities is used as the material for the heat generating resistor 12H.

Incidentally, an energization test for heating to 250° C. is conducted considering the fact the temperature of a heat generating resistor reaches 200° C. to 250° C. when the temperature of intake air into a car becomes 100° C. In addition, the rate of change of resistance depends upon the measurement of a resistance value at 0° C. before energization and of a resistance value at 0° C. after the energization in a thermostatic chamber.

The change in resistance occurs somewhat differently according to resistor material and, for example, the resistance change after the elapse of 1000 hours reaches 0.1% to 0.7%. On the other hand, in usual electric circuits, depending on arrangement or circuit mode, the tolerance of the resistance change is approximately 0.05% to 0.3%. Therefore, the change as much as 0.7% makes it difficult to use it intact as the heat generating resistor 12H.

Both the vertical and horizontal axes in the illustration is indicated in terms of a logarithmic scale, and all the three types of resistors (X), (Y) and (Z) show a decreased rate of change of resistance with the passage of time. That is, it is considered that the suppression of the resistance change in the actually used condition is feasible by initially implementing the heating through energization to change the resistance value in advance.

Furthermore, referring to FIG. 10, a description will be given hereinbelow of a rate of change of temperature coefficient of resistance of the heat generating resistor 12H, at energization heating before an aging treatment, to be used in the thermal type airflow sensor according to this.

Figure 10:
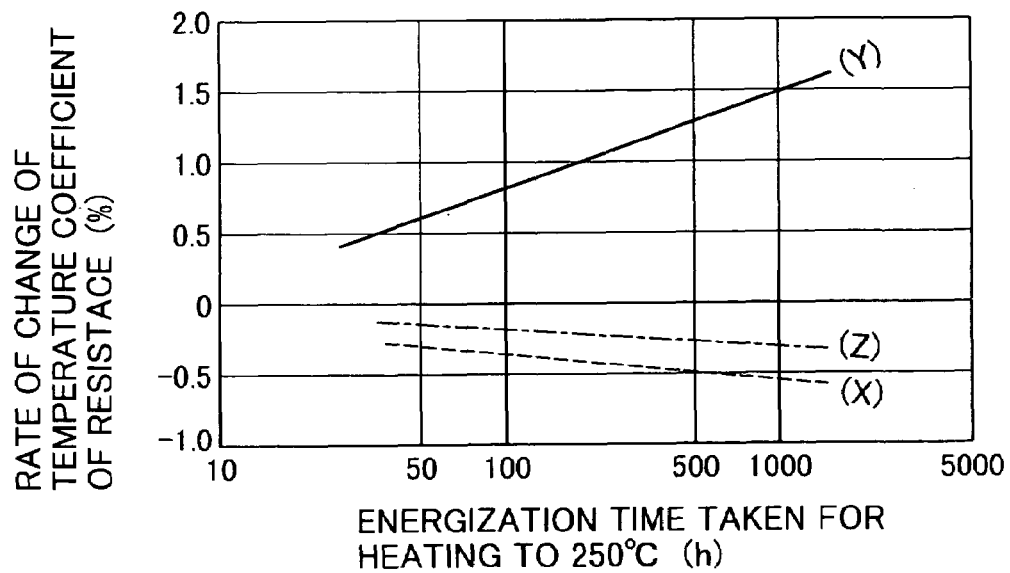
FIG. 10 is an illustration for explaining a rate of change of temperature coefficient of resistance of a heat generating resistor, at energization heating before an aging treatment, to be used in the thermal type airflow sensor according to the first embodiment of the present invention.

FIG. 10 is an illustration for explaining a rate of change of temperature coefficient of resistance of a heat generating resistor, at energization heating before an aging treatment, to be used in the thermal type airflow sensor according to the first embodiment of the present invention.

In the illustration, the horizontal axis represents time with a logarithmic scale in the case of energization heating to 250° C., while the vertical axis denotes a rate (%) of change of temperature coefficient of resistance of the heat generating resistor 12H with a logarithmic scale.

In the illustration, (X) designates the transition of a rate of change of temperature coefficient of resistance in a case in which a platinum-made thin-film resistor is used as the material for the heat generating resistor 12H. In addition, (Y) depicts the transition of a rate of change of temperature coefficient of resistance in the case of employment of a resistor in which a single-crystal silicon doped with P (phosphorus) forming impurities is used as the material for the heat generating resistor 12H, and (Z) indicates the transition of a rate of change of temperature coefficient of resistance of a resistor in which polysilicon doped with P (phosphorus) forming impurities is used as the material for the heat generating resistor 12H.

Incidentally, the rate of change of temperature coefficient of resistance is to be calculated as a function of resistance values at 0° C. and 100° C. in a thermostatic chamber. It was found that the tendency in temperature coefficient of resistance is toward increase in the case of (Y) in which a single-crystal silicon is doped with P, whereas it is toward decrease in the case of the other materials (X) and (Z).

In addition, when the rate of change of resistance and the rate of change of temperature coefficient of resistance were measured with the diverse change in energization heating temperature, the change trends in FIGS. 9 and 10 were the same until the heating temperature reaches the vicinity of 500° C. Conversely, when the energization heating temperature exceeds 500° C., the resistance value drops extremely, or the change of temperature coefficient of resistance shows a different trend, so that it is undesirable as the aging condition. Still additionally, when a heat generating resistor is located in the interior of a thermostatic chamber to apply a predetermined temperature instead of heating by energization, the resistance change is extremely slight so that it is unsuitable as the aging condition. Moreover, since the heat generating resistor is heated up to 200° C. to 250° C. when the temperature measuring resistor is at 100° C., it is preferable that the aging temperature due to the energization heating is higher than the maximum temperature in the actually used condition and is in a range of 250° C. to 500° C. which does not cause irregular variation in physical property of the resistor.

Still furthermore, as the temperature becomes higher than 250° C., the time needed for the aging becomes shorter, and in the practical use, temperatures above 350° C. exhibited a great effect. In addition, as the energization heating temperature approaches 500° C., the resistance value or the dispersion in temperature coefficient of resistance increases. In design of a heat generating resistor, the resistance value before the aging is prescribed so that the resistance value after the aging assumes a predetermined value, while a large dispersion after the aging treatment causes a difficult design. In order to reduce the dispersion in resistance value after the aging treatment in the practical range, preferably the energization heating temperature is set below 400° C. That is, optimally, the energization heating temperature is set in a range from 350° C. to 400° C.

Moreover, referring to FIGS. 11 and 12, a description will be given hereinbelow of a temperature coefficient of resistance of a heat generating resistor, before and after an aging treatment, for use in the thermal type airflow sensor according to this embodiment.

Figure 11:
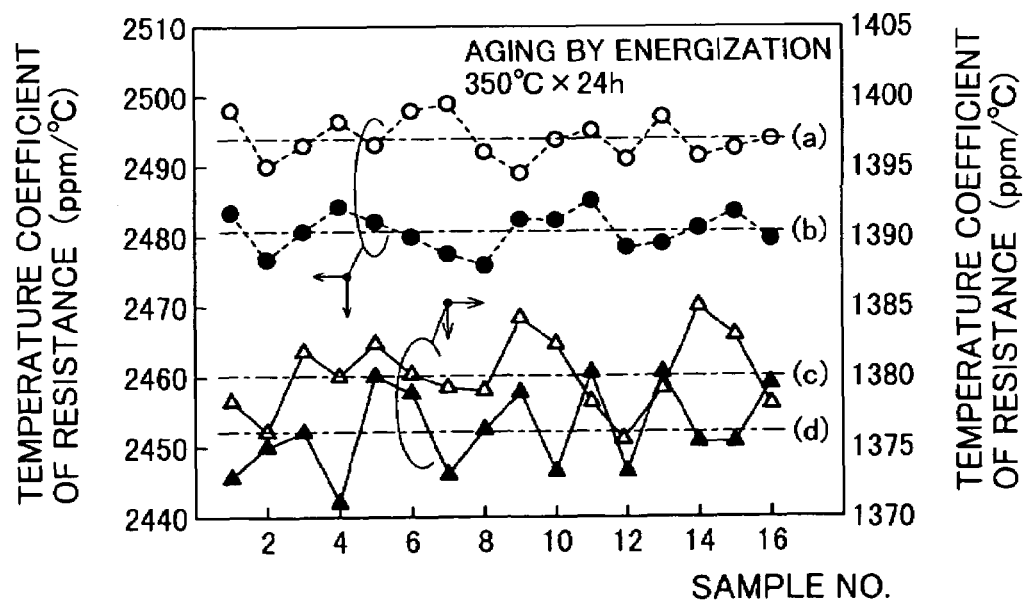
FIG. 11 is an illustration for explaining a temperature coefficient of resistance of a heat generating resistor, before and after an aging treatment, for use in the thermal type airflow sensor according to the first embodiment of the present invention.
Figure 12:
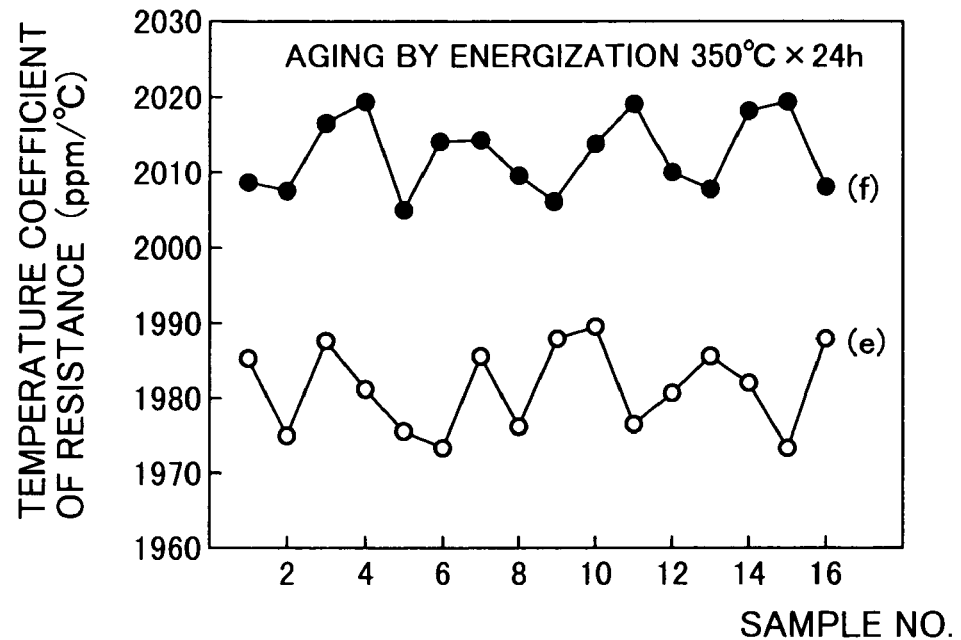
FIG. 12 is an illustration for explaining a temperature coefficient of resistance of a heat generating resistor, before and after an aging treatment, for use in the thermal type airflow sensor according to the first embodiment of the present invention.

FIGS. 11 and 12 are illustrations for explaining a temperature coefficient of resistance of a heat generating resistor, before and after an aging treatment, for use in the thermal type airflow sensor according to the first embodiment of the present invention.

In the aging condition based on the energization heating, the heating temperature is set at 350° C.×24h, and in the illustrations, the horizontal axis represents sample number N=16. Because of the large dispersion, the change in temperature coefficient of resistance is measured using N=16 samples. The vertical axis represents a temperature coefficient of resistance (ppm/° C.) of the heat generating resistor 12H.

In FIG. 11, (a) indicates a temperature coefficient of resistance before aging in a case in which a platinum-made thin-film is used as a heat generating resistor, and (b) indicates a temperature coefficient of resistance of the platinum-made thin-film after the aging. In addition, (c) depicts a temperature coefficient of resistance of a polysilicon doped with P, serving as a heat generating resistor, before the aging, and (d) depicts a temperature coefficient of resistance of the polysilicon doped with P, serving as a heat generating resistor, after the aging. In FIG. 12, (e) represents a temperature coefficient of resistance of a single-crystal silicon doped with P and used as a heat generating resistor, before the aging, and (f) represents a temperature coefficient of resistance of the single-crystal silicon doped with P and used as the heat generating resistor, after the aging.

In the platinum-made thin-film, the temperature coefficient of resistance decreases from 2494 ppm/° C. to 2481 ppm/° C. (that is, approximately −0.52%) due to the aging, while in the polysilicon doped with P, it decreases from 1380 ppm/° C. to 1376 ppm/° C. (that is, approximately −0.29%), and even in the single-crystal silicon doped with P, it increases from 1982 ppm/° C. to 2013 ppm/° C. (that is, approximately 1.6%).

Accordingly, when heat generating resistors 12H and temperature measuring resistors 12C are made from the same material and the temperature coefficients of resistance of the pluralities of heat generating resistors 12H are measured for the implementation of aging by energization heating and averaged, with the platinum-made thin-film or the polysilicon doped with P, the heat generating resistor 12H shows a lower temperature coefficient of resistance than the temperature measuring resistor 12C, while with the single-crystal silicon doped with P, the heat generating resistor 12H shows a higher temperature coefficient of resistance than the temperature measuring resistor 12C, with the variation therebetween being above approximately ±0.25%. Thus, with this embodiment, although a difference in temperature coefficient of resistance occurs between the heat generating resistor 12H and the temperature measuring resistor 12C, no problem exists in the practical use.

Moreover, referring to FIG. 13, a description will be given hereinbelow of a rate of change of resistance of a heat generating resistor, at energization heating after an aging treatment, for use in the thermal type airflow sensor according to this embodiment.

Figure 13:
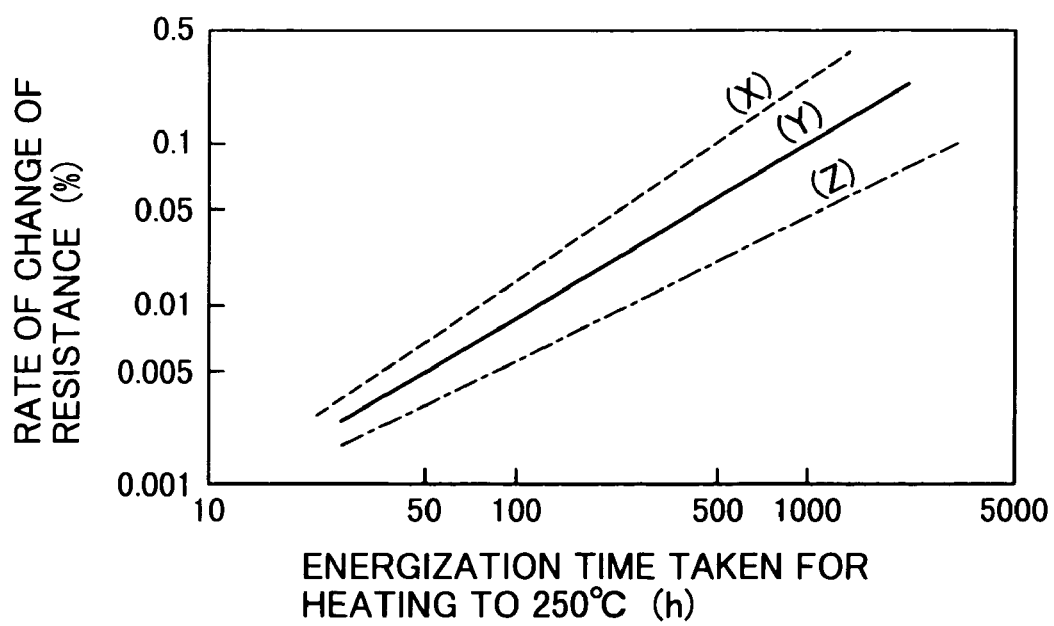
FIG. 13 is an illustration for explaining a rate of change of resistance of a heat generating resistor, at energization heating after an aging treatment, for use in the thermal type airflow sensor according to the first embodiment of the present invention.

FIG. 13 is an illustration for explaining a rate of change of resistance of a heat generating resistor, at energization heating after an aging treatment, for use in the thermal type airflow sensor according to the first embodiment of the present invention.

In the illustration, the horizontal axis represents time with a logarithmic scale in the case of energization heating to 250° C., while the vertical axis denotes a rate (%) of change of resistance of the heat generating resistor 12H with a logarithmic scale.

In the illustration, (X) designates the transition of a rate of change of resistance in a case in which a platinum-made thin-film resistor is used as the material for the heat generating resistor 12H. In addition, (Y) depicts the transition of a rate of change of resistance in the case of employment of a resistor in which a single-crystal silicon doped with P (phosphorus) forming impurities is used as the material for the heat generating resistor 12H, and (Z) indicates the transition of a rate of change of resistance of a resistor in which polysilicon doped with P (phosphorus) forming impurities is used as the material for the heat generating resistor 12H.

Energization heating of 350° C.×24 h is made as an aging treatment condition and an energization heating test is conducted at 250° C. after the aging treatment. Incidentally, the measurement of the rate of change of resistance is made by measuring a resistance value at 0° C. before the energization and a resistance at ° C. after the energization in a thermostatic chamber.

Every material shows a decreased resistance variation due to the implementation of the aging, thus considerably improving the durability. In addition, even using the other resistor materials, such as gold, copper, aluminum, chromium, nickel, tungsten, permalloy (FeNi) or titanium, a similar effect is obtainable. Still additionally, although the aging condition shown in FIG. 13 is 350° C.×24 h, a prolongation of the aging time or a further increase in energization heating temperature from 350° C. to, for example, 500° C. may lessen the resistance variation. However, in this case, the variation of the temperature coefficient of resistance exceeds ±0.25 stated above, but no problem occurs in the practical use.

Moreover, in this embodiment, although the aging as long as 24h is also possible because a large number of heat generating resistors are treated collectively for the aging, in view of facilities and working time, difficulty is encountered in conducting the energization aging thereof in a state divided individually.

As described above, according to this embodiment, since heat generating resistors of a plurality of airflow sensors formed on a semiconductor wafer are connected through second lead conductors to each other and an aging treatment is conducted through the use of energization heating method, the resistance values thereof do not vary even if they are put to use for a long time, and a simple-structure physical quantity detecting device is attainable.

In addition, since a narrow portion is provided in the middle of the second lead conductor to make disconnection in this narrow portion, easy insulation of the heat generating resistor becomes feasible.

Still additionally, the durability is considerably improvable. Therefore, as compared with an ordinary thermal type airflow sensor 10 in which an increase in temperature of a heat generating resistor is limited to 100° C. to 150° C. with respect to the ambient temperature, according to this embodiment, the temperature can be further increased up to a value higher by approximately 200° C. than the ambient temperature. To increase the temperature to a high value, high-boiling-point substances such as oil contained in a fluid are also evaparable, thus avoiding contamination. Accordingly, it is possible to solve the problem of the flow rate characteristics varying stemming from the dirt of the sensor.

Moreover, in the thermal type airflow sensor 10, since its heat generating resistor is extremely small in size, waterdrops or the like are attached thereto under the actual motor vehicle environments, or when the water vapor is condensed, a long time is taken until evaporation. Since the flow rate characteristic produces an abnormal value during the evaporation, it is desirable to accomplish the evaporation for as a short time as possible. For this reason, with this embodiment, the durability is improvable, and the temperature of the heat generating resistor can be increased to a high value, which reduces the effects of the waterdrops or the like.

Furthermore, referring to FIG. 14, a description will be given hereinbelow of a thermal type airflow sensor serving as a physical quantity detecting device according to a second embodiment of the present invention.

Figure 14:
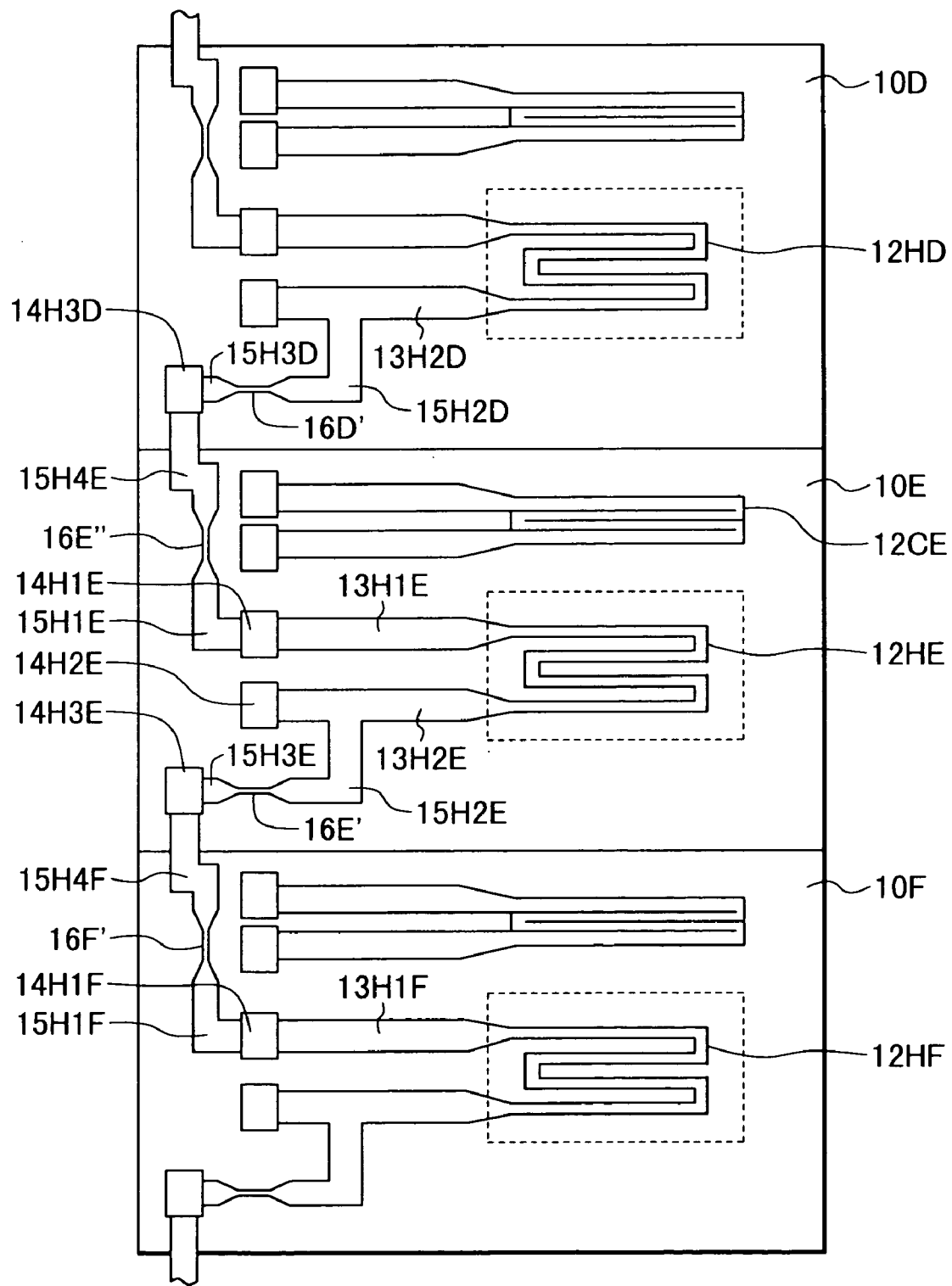
FIG. 14 is a plan view showing a thermal type airflow sensor serving as a physical quantity detecting device according to a second embodiment of the present invention.

FIG. 14 is a plan view showing a thermal type airflow sensor serving as a physical quantity detecting device according to a second embodiment of the present invention. FIG. 14 is in contradistinction to FIG. 7, and also in this embodiment, as described with reference to FIG. 6, a plurality of thermal type airflow sensors 10 are simultaneously produced on a semiconductor wafer according to the semiconductor micromachining technique. FIG. 14 shows, of these, three airflow sensors 10D, 10E and 10F. The basic construction of each of the airflow sensors 10D, 10E and 10F is similar to that shown in FIG. 1. For example, the airflow sensor 10E is equipped with a heat generating resistor 12HE and a temperature measuring resistor 12CE.

Both end portions of the heat generating resistor 12HE are connected through first lead conductors 13H1E and 13H2E to electrodes 14H1E and 14H2E, respectively. A second lead conductor 15H1E connected to the electrode 14H1E is connected through a narrow portion 16E" and a second lead conductor 15H4E to an electrode 14H3D of the airflow sensor 10D. A second lead conductor 15H2 connected to the first lead conductor 13H2E is connected through a narrow portion 16E' and a second lead electrode 15H3 to an electrode 14H3E. A heat generating resistor 12HD of the airflow sensor 10D is connected to an electrode 14H3D through a first lead conductor 13H2D, an electrode 14H2D, a second lead conductor 15H2D, a narrow portion 16D' and a second lead conductor 15H3D. In addition, a heat generating resistor 12HF of the airflow sensor 10F is connected to a heat generating resistor 12HE through a first lead conductor 13H1F, an electrode 14H1F, a second lead conductor 15H1F, a narrow portion 16F' and a second lead conductor 15H4F. In this way, the heat generating resistors 12HD, 12HE and 12HF are connected in series so that the energization aging treatment is feasible as well as the first embodiment.

Moreover, in this embodiment, two disconnection portions 16E' and 16E" are placed with respect to one airflow sensor 10E, thereby achieving more sure insulation of the heat generating resistor 12E. Still moreover, even if the substrate supporting member 22 shown in FIG. 5 is made of a metallic material an electric potential bears on, it is still available.

As described above, according to this embodiment, in addition to the effects of the first embodiment, since two narrow portions lie in the middle of a second lead conductor to produce disconnection, sure insulation of the heat generating resistor is possible.

Furthermore, referring to FIG. 15, a description will be given hereinbelow of a thermal type airflow sensor serving as a physical quantity detecting device according to a third embodiment of the present invention.

Figure 15:
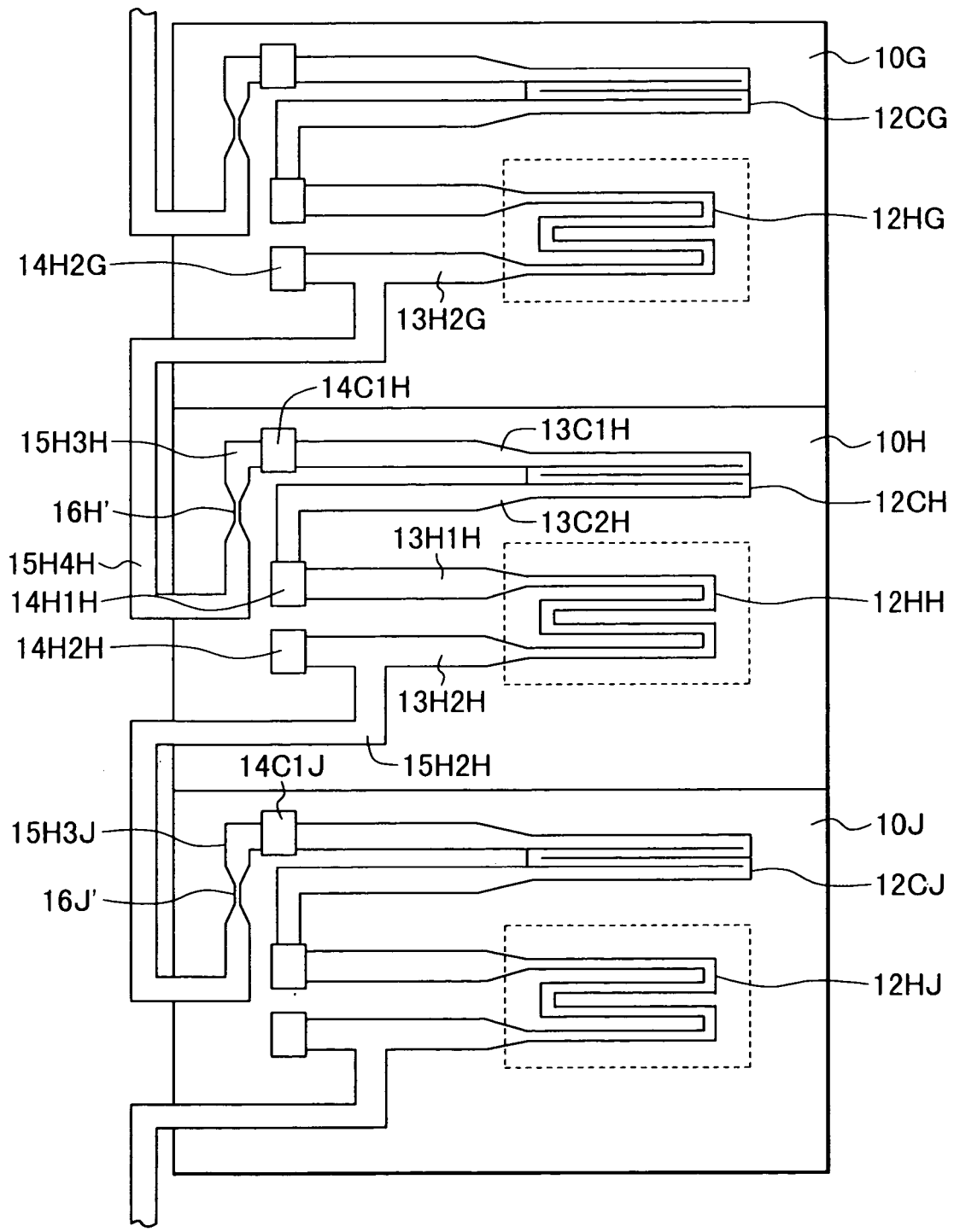
FIG. 15 is a plan view showing a thermal type airflow sensor serving as a physical quantity detecting device according to a third embodiment of the present invention.

FIG. 15 is a plan view showing a thermal type airflow sensor serving as a physical quantity detecting device according to a third embodiment of the present invention. Also in this embodiment, as mentioned with reference to FIG. 6, a plurality of thermal type airflow sensors 10 are simultaneously produced on a semiconductor wafer by means of the semiconductor micromachining technique. In addition, FIG. 15 shows, of these, three airflow sensors 10G, 10H and 10J. The basic construction of each of the airflow sensors 10G, 10H and 10J is similar to that shown in FIG. 1. For example, the airflow sensor 10H is provided with a heat generating resistor 12HH and a temperature measuring resistor 12CH.

Both end portions of the heat generating resistor 12HH are connected through first lead conductors 13H1H and 13H2H to electrodes 14H1H and 14H2H, respectively. In addition, both end portions of the temperature measuring resistor 12CH are connected through first lead conductors 13C1H and 13C2H to electrodes 14C1H and 14H1H, respectively. A second lead conductor 15H3H connected to the electrode 14C1H is connected through a narrow portion 16E" and a second lead conductor 15H4H to a first lead conductor 13H2G of the airflow sensor 10G. A second lead conductor 15H2H connected to the first lead conductor 13H2H is connected through a narrow portion 16J' and a second lead electrode 15H3J to an electrode 14C1J. That is, a heat generating resistor 12HG of the airflow sensor 10G is connected to the temperature measuring resistor 12CH through a first lead conductor 13H2G, a second lead conductor 15H4H, a narrow portion 16H', an electrode 14C1H and a first lead conductor 13C1H. The temperature measuring resistor 12CH is connected through a first lead conductor 13C2H and an electrode 14H1H to the heat generating resistor 12HH. In this way, the heat generating resistors 12HG, 12HH and 12HJ and the temperature measuring resistors 12CG, 12CH and 12CJ are connected in series.

In this case, as mentioned with reference to FIG. 8, the temperature measuring resistor 12J requires an extremely large power for heating and, hence, generates less heat when the same currents flow in the temperature measuring resistor 12CH and the heat generating resistor 12HH. Thus, even with the construction as shown in FIG. 15, the aging of the heat generating resistors 12HG, 12HH and 12HJ becomes possible. Accordingly, when the second lead conductors cannot be formed at both the end portions of the heat generating resistor for reasons of a problem in wiring layout or the like, the construction design can also be made like this embodiment.

In addition, with the heat generating resistor 12H and the temperature measuring resistor 12C being connected to each other, it is possible to simultaneously check not only the disconnection of the heat generating resistor 12H or the like but also the disconnection of the temperature measuring resistor 12C or the like.

Incidentally, instead of the electrical connection between the heat generating resistor 12H and the temperature measuring resistor 12C, it is also possible in the aging that another resistor is formed on a semiconductor substrate 11 and a second lead conductor is set up for the same resistor.

As described above, according to this embodiment, in addition to the effects of the first embodiment, the inspection of the temperature measuring resistor becomes also possible.

Furthermore, referring to FIGS. 16 and 17, a description will be given hereinbelow of a construction of a thermal type airflow sensor forming a physical quantity detecting device according to a fourth embodiment of the present invention.

Figure 16:
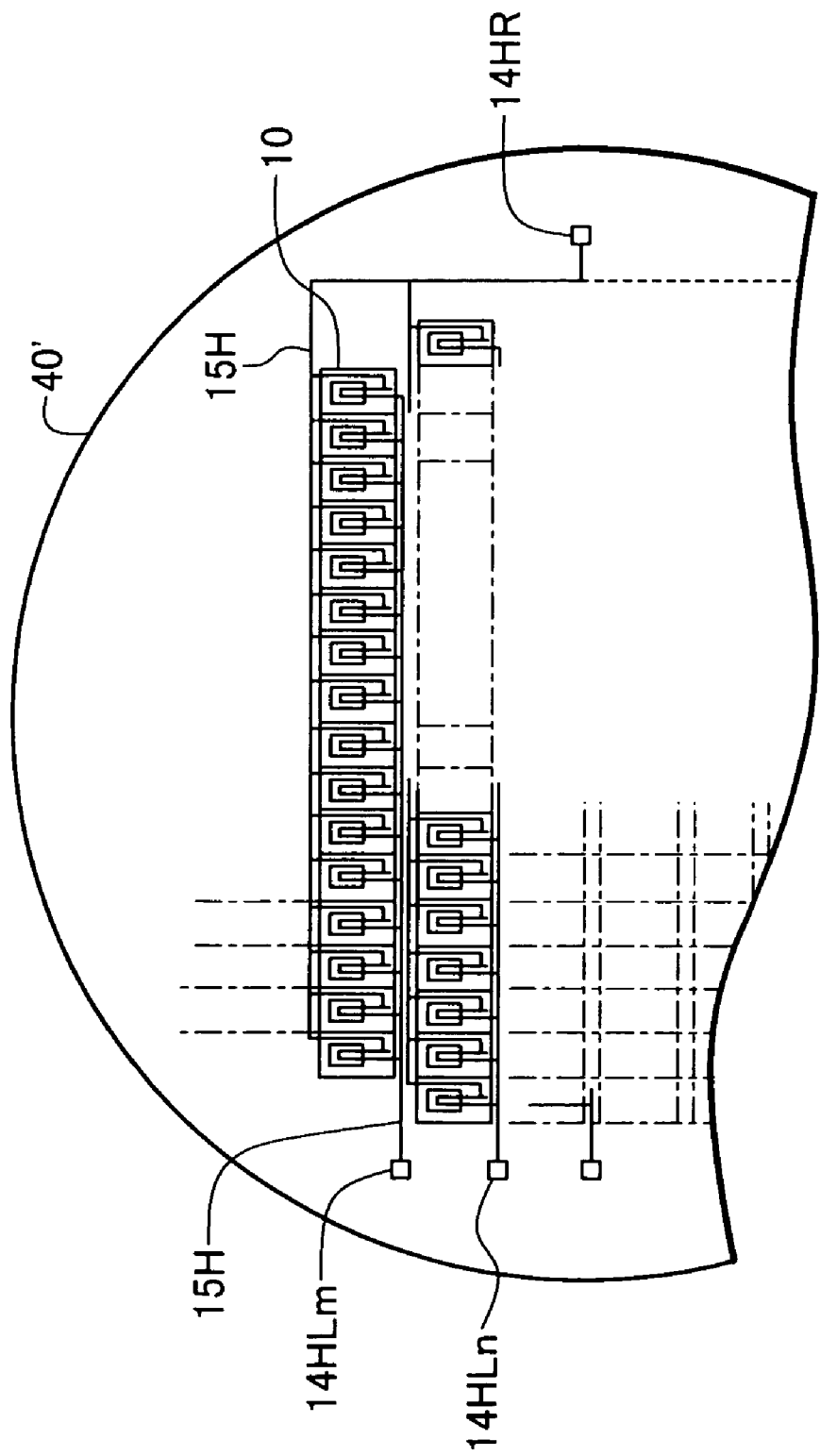
FIG. 16 is a plan view showing a thermal type airflow sensor serving as a physical quantity detecting device, at its manufacturing, according to a fourth embodiment of the present invention.
Figure 17:
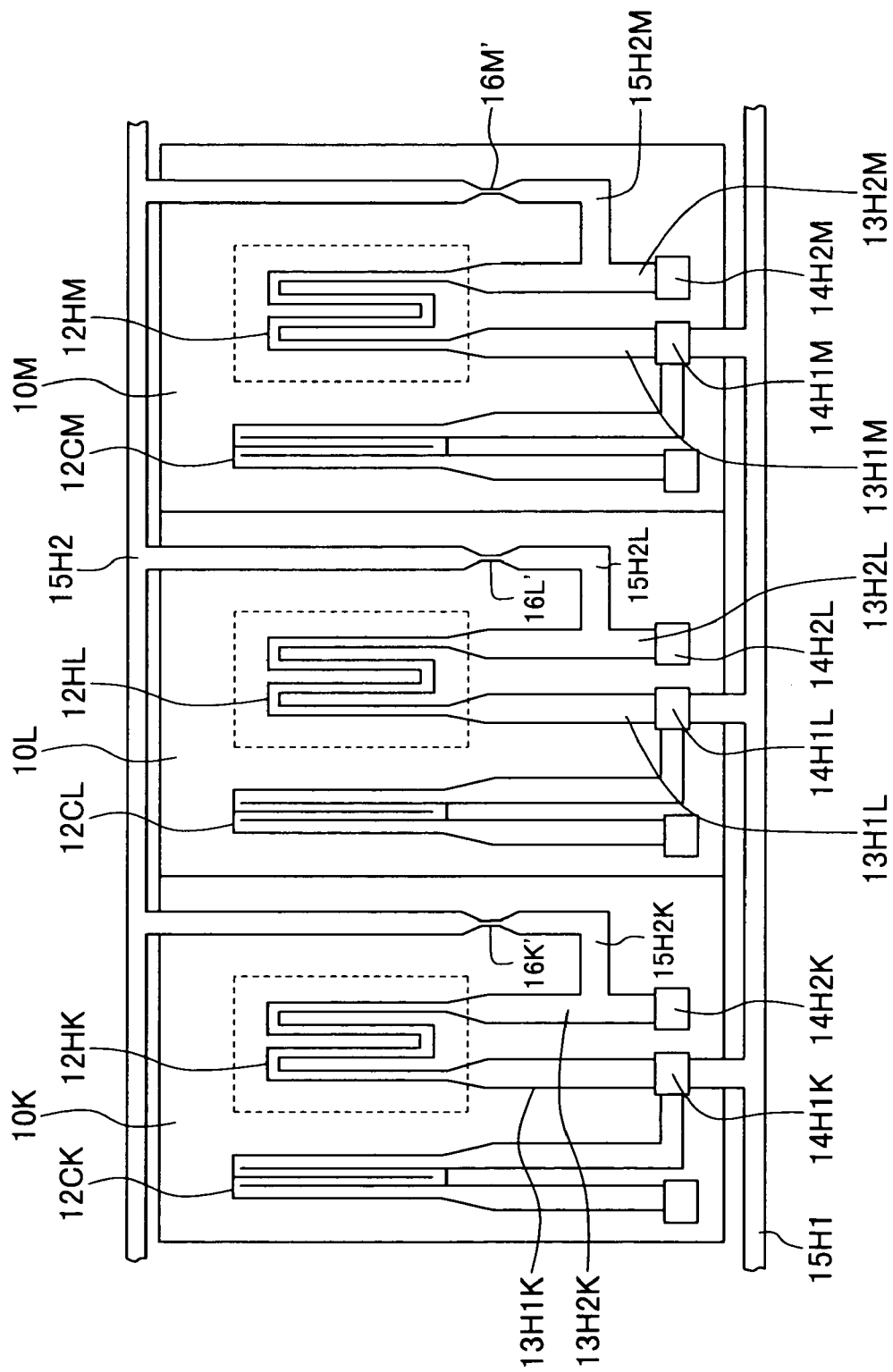
FIG. 17 is an enlarged plan view showing an essential part in FIG. 16.

FIG. 16 is a plan view showing a thermal type airflow sensor serving as a physical quantity detecting device, at its manufacturing, according to a fourth embodiment of the present invention, and FIG. 17 is an enlarged plan view showing an essential part in FIG. 16.

As FIG. 16 shows, a plurality of thermal type airflow sensors 10 are simultaneously manufactured on a semiconductor wafer 40' by means of the semiconductor micromachining technique. In a case in which the semiconductor has a diameter of approximately 12.5 cm (5 inches), the airflow sensors 10 to be produced concurrently are approximately 600 in number. While the airflow sensors 10 are arranged on the semiconductor wafer 40' in a matrix form, a maximum of approximately 40 sensors 10 are producible in one member.

The construction of the airflow sensor 10 is similar to that described with reference to FIGS. 1 to 3. In addition, a plurality of airflow sensors 10 are connected in parallel through a second lead conductor 15H between an electrode 14HLm and an electrode 14HR. Since a thin-wall portion 11A made in a semiconductor substrate 11 is easy to damage, in the case of the construction of a plurality of heat generating resistors 12H being connected in series, even if damage of the thin-wall portion occurs at least one place, the aging difficulty spans all the plurality of places. On the other hand, in this embodiment, the aging becomes possible through the parallel connection among the head generating resistors 12H.

In this case, as FIG. 17 shows, heat generating resistors 12HK, 12HL and 12HM of airflow sensors 10K, 10L and 10M are connected through first lead conductors 13H1K, 13H2K, 13H1L, 13H2L, 13H1M and 13H2M to electrodes 14H1K, 14H2K, 14H1L, 14H2L, 14H1M and 14H2M, respectively. The electrodes 14H1K, 14H1L and 14H1M are connected in common through a second lead conductor 15H1. In addition, the electrode 14H2K, 14H2L and 14H2M are connected in common by a second lead conductor 15H2 through second lead conductors 15H2K, 15H2L, 15H2M and narrow portions 16K', 16L', 16M'. Thus, the heat generating resistors 12HK, 12HL and 12HM of the airflow sensors 10K, 10L and 10M are connected in parallel by a second lead conductor 15H1 and a second lead conductor 15H2, and even if a trouble occurs in one heat generating resistor, the aging treatment of the other heat generating resistors is possible.

As described above, according to this embodiment, in addition to the effects of the first embodiment, even if a trouble occurs in one heat generating resistor, the aging treatment of the other heat generating resistors is possible.

Furthermore, referring to FIG. 18, a description will be given hereinbelow of a construction of a thermal type airflow sensor serving as a physical quantity detecting device according to a fifth embodiment of the present invention.

Figure 18:
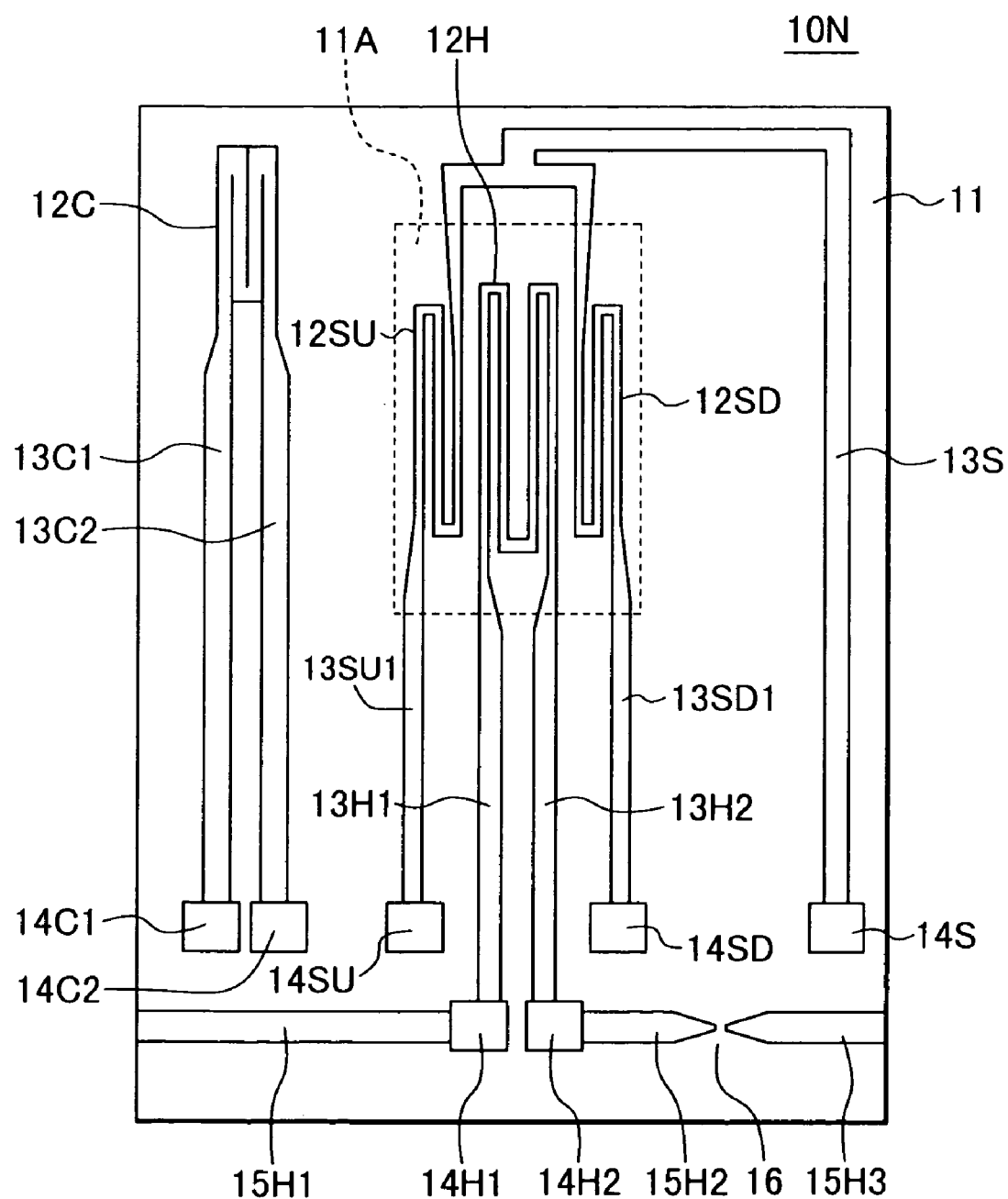
FIG. 18 is a plan view showing a thermal type airflow sensor serving as a physical quantity detecting device according to a fifth embodiment of the present invention.

FIG. 18 is a plan view showing a thermal type airflow sensor serving as a physical quantity detecting device according to a fifth embodiment of the present invention. The same numerals as those in FIG. 1 represent the same parts.

A thermal type airflow sensor 10N is provided with a heat generating resistor 12H and a temperature measuring resistor 12C, formed on a semiconductor substrate 11, with the heat generating resistor 12H being formed in a thin-wall portion 11A. Both end portions of the heat generating resistor 12H are connected through first lead conductors 13H1 and 13H2 to electrodes 14H1 and 14H2, respectively. A second lead conductor 15H1 connected to the electrode 14H1 extends to an outer circumferential portion of the airflow sensor 10. Second lead conductors 15H2 and 15H3 connected to the electrode 14H2 also extend to the outer circumferential portion of the airflow sensor 10, but a disconnection portion 16 is made therebetween to set up electrical non-conduction.

In addition, an upstream side temperature sensing resistor 12SU is placed on the upstream side of the heat generating resistor 12H, while a downstream side temperature sensing resistor 12SD is put on the downstream side thereof. One end portion of the upstream side temperature sensing resistor 12SU is connected through a first lead electrode 13SU1 to an electrode 14SU. Also, one end portion of the downstream side temperature sensing resistor 12SD is connected through a first lead conductor 13SD1 to an electrode 14SD. Moreover, the other end portion of the upstream side temperature sensing resistor 12SD and the other end portion of the downstream side temperature sensing resistor 12SD are connected through a first lead electrode 13S to an electrode 14S.

Also in this embodiment, a plurality of heat generating resistors are connected in series through a second lead conductor 15H and in this state the energization aging is conducted on the heat generating resistor 12H, thereby preventing the resistance variation. The resistances of the upstream side temperature sensing resistor 12SU and the downstream side temperature sensing resistor 12SD slightly vary from the influence of heat of the heat generating resistor 12H in the actually used condition. For this reason, although not illustrated, when a second lead conductor is also given to these temperature sensing resistors 12SU and 12SD for conducting the energization aging as well as the heat generating resistor 12H, the reliability is improvable.

As described above, according to this embodiment, besides the effects of the first embodiment, the reliability is improvable.

Furthermore, referring to FIGS. 19 and 20, a description will be given hereinbelow of a construction of a thermal type airflow sensor serving as a physical quantity detecting device according to a sixth embodiment of the present invention.

Figure 19:
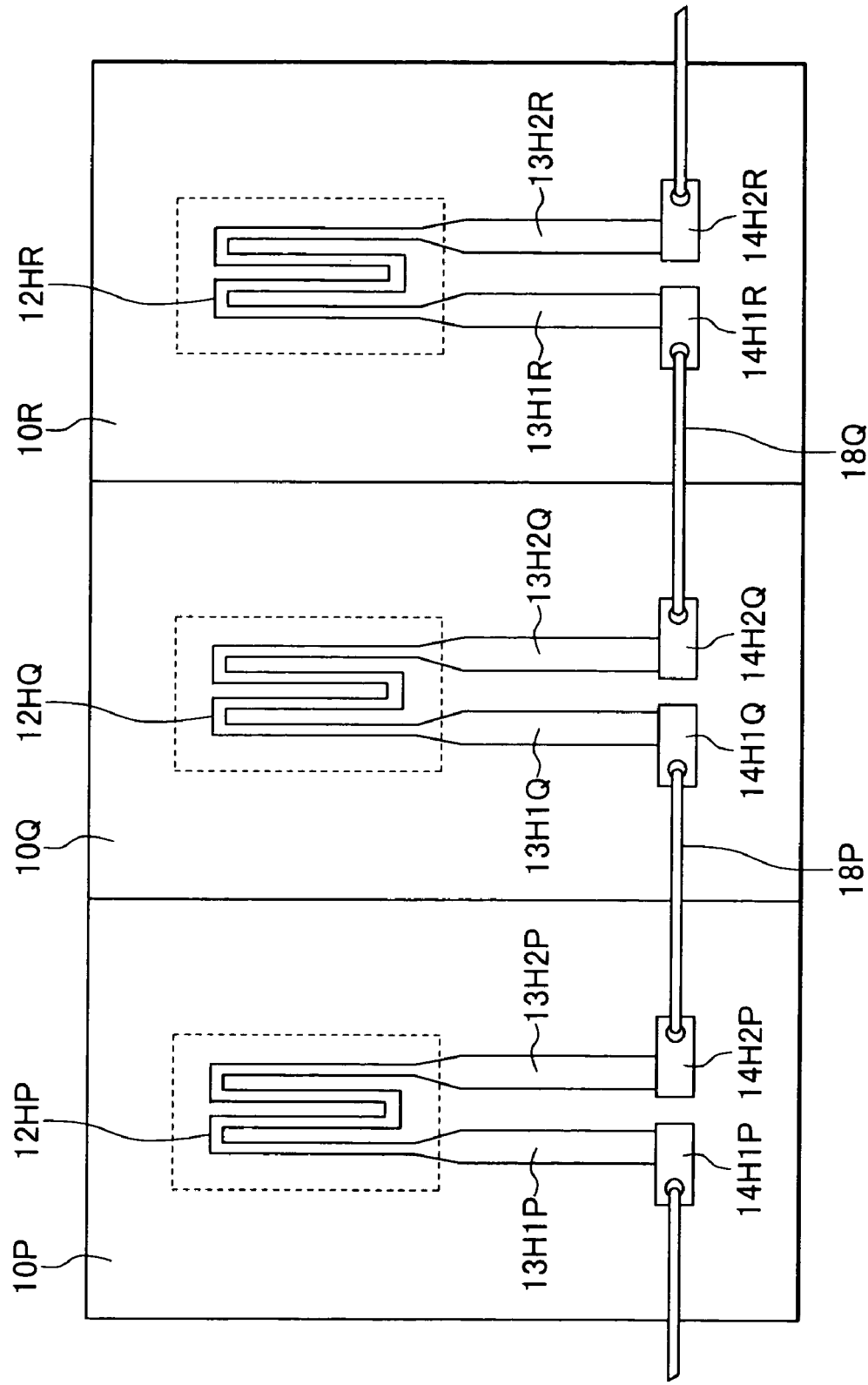
FIG. 19 is a plan view showing a thermal type airflow sensor serving as a physical quantity detecting device, at its aging treatment, according to a sixth embodiment of the present invention.
Figure 20:
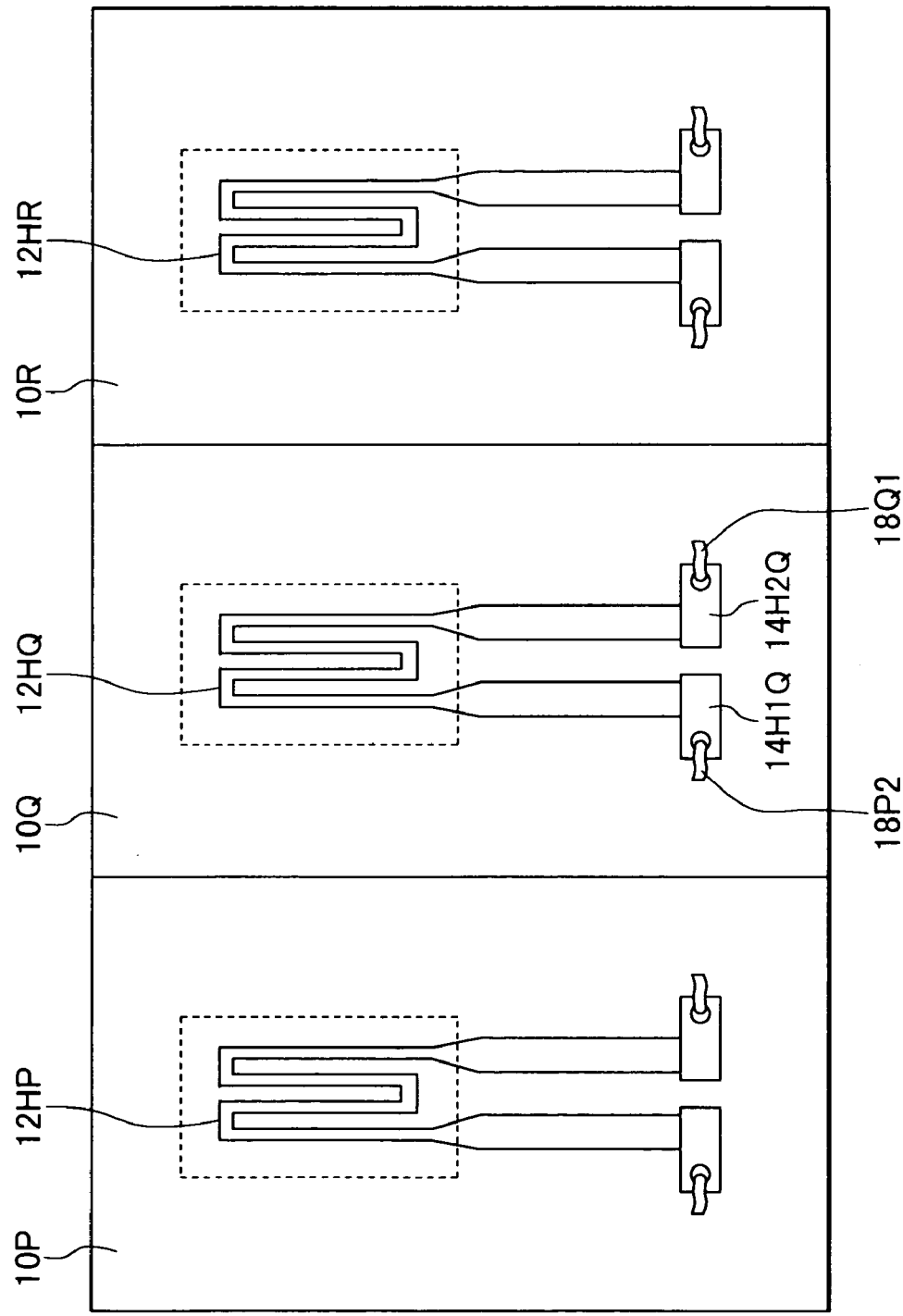
FIG. 20 is a plan view showing the thermal type airflow sensor serving as a physical quantity detecting device after the aging treatment according to the sixth embodiment of the present invention.

FIG. 19 is a plan view showing a thermal type airflow sensor serving as a physical quantity detecting device, at its an aging treatment, according to a sixth embodiment of the present invention, and FIG. 20 is a plan view showing the thermal type airflow sensor serving as a physical quantity detecting device after the aging treatment according to the sixth embodiment of the present invention. Also in this embodiment, as described with reference to FIG. 6, a plurality of thermal type airflow sensors 10 are simultaneously manufactured on a semiconductor wafer by means of the semiconductor micromachining technique. Moreover, FIGS. 19 and 20 show, of these, three airflow sensors 10P, 10Q and 10R. The basic construction of each of the airflow sensors 10P, 10Q and 10R is similar to that shown in FIG. 1. For example, the airflow sensor 10Q is provided a heat generating resistor 12HQ and a temperature measuring resistor, not shown.

Both end portions of the heat generating resistor 12HP are connected through first lead conductors 13H1P and 13H2P to electrodes 14H1P and 14H2P. In addition, both end portions of the heat generating resistor 12HQ are connected through first lead conductors 13H1Q and 13H2Q to electrodes 14H1Q and 14H2Q. Still additionally, both end portions of the heat generating resistor 12HR are connected through first lead conductors 13H1R and 13H2R to electrodes 14H1R and 14H2R.

Moreover, the electrode 14H2P and the electrode 14H1Q are connected to each other through a metal wire 18P equivalent to the second lead conductor. Still moreover, the electrode 14H2Q and the electrode 14H1R are connected to each other through a metal wire 18Q equivalent to the second lead conductor. In this way, the heat generating resistors 12HP, 12HQ and 12HR are connected in series and, hence, can simultaneously undergo the aging treatment.

With the method of this embodiment, the area needed for the lead conductor becomes unnecessary, which can increase the number of thermal type airflow sensors 10 to be formed within a semiconductor wafer.

After the completion of the aging treatment, the metal wires 18P and 18Q are cut off by a cutter or the like. This eliminates the worry of the influence on the thermal type airflow sensor 10 unlike the fuse method or the laser method, besides offering the most certain disconnecting method.

FIG. 20 illustrates a state after the cutting of the metal wires 18P and 18Q. After the cutting of the metal wires 18P and 18Q, the disconnected metal wires 18P2 and 18Q1 remain on the electrodes 14H1Q and 14H2Q.

As described above, according to this embodiment, besides the effects of the first embodiment, the number of sensors to be manufactured is increasable, and sure disconnection is securable.

Furthermore, referring to FIGS. 21 and 22, a description will be given hereinbelow of a construction of a thermal type airflow sensor serving as a physical quantity detecting device according to a seventh embodiment of the present invention.

Figure 21:
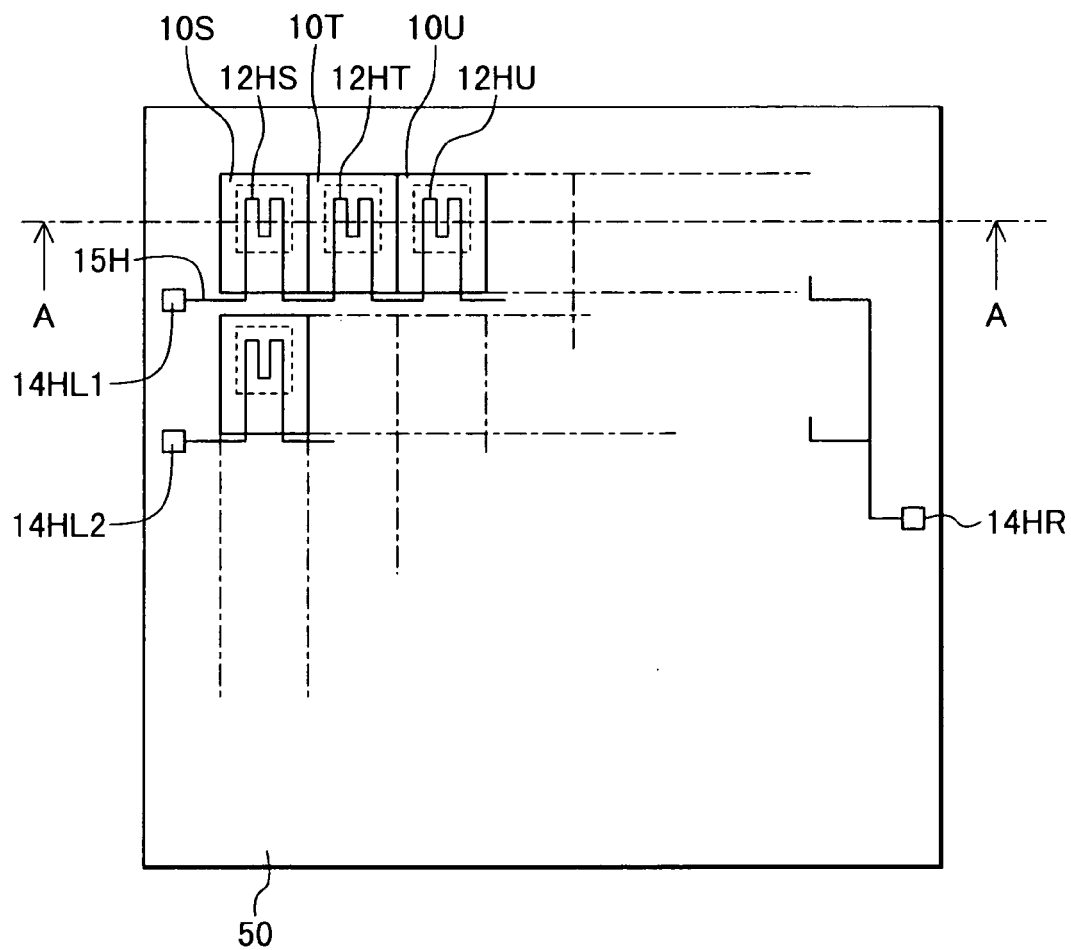
FIG. 21 is a plan view showing a thermal type airflow sensor serving as a physical quantity detecting device according to a seventh embodiment of the present invention.
Figure 22:
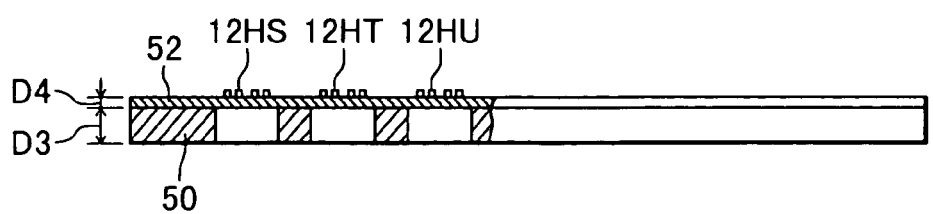
FIG. 22 is a cross-sectional view taken along A—A of FIG. 21.

FIG. 21 is a plan view showing a thermal type airflow sensor serving as a physical quantity detecting device according to a seventh embodiment of the present invention, and FIG. 22 is a cross-sectional view taken along A—A of FIG. 21.

Although in the embodiments described with reference to FIGS. 1 to 20 a semiconductor substrate has been used as a substrate for the formation of the heat generating resistors, the substrate material is not limited to the semiconductor, but other substrates are usable. In this embodiment, a metal is employed as a substrate material.

As FIG. 21 shows, a plurality of thermal type airflow sensors 10S, 10T and 10U are simultaneously manufactured on a metal-made substrate 50. Each of the airflow sensors 10S, 10T and 10U has a construction similar to that described with reference to FIGS. 1 to 3, and is provided with heat generating resistors 12HS, 12HT and 12HU. In addition, although not illustrated, it also includes a temperature measuring resistor. The heat generating resistors 12HS, 12HT and 12HU are connected in series through a second lead conductor 15H between an electrode 14HL1 and an electrode 14HR, and are simultaneously subjected to the aging treatment. In a case in which the metal-made substrate 50 has a size of 10 $cm^2$, the number of airflow sensors 10 to be manufactured simultaneously reaches approximately 400 to 500.

Secondly, a cross-sectional construction thereof will be described with reference to FIG. 22.

an insulating film 52, made of polyimide or the like, is formed on the metal-made substrate 50. The thickness D3 of the metal-made substrate 50 is, for example, 200 $\mu$m. The thickness D4 of the insulating film 52 is, for example, 6 to 10 $\mu$m. On the insulating film 52, are formed the heat generating resistors 12HS, 12HT and 12HU, the first lead conductor and the second lead conductor 15H.

As described above, according to this embodiment, the substrate other than a semiconductor substrate can also achieve the effects of the first embodiment.

Moreover, referring to FIGS. 23 and 24, a description will be given hereinbelow of a semiconductor type pressure sensor serving as a physical quantity detecting device according to an eighth embodiment of the present invention.

Figure 23:
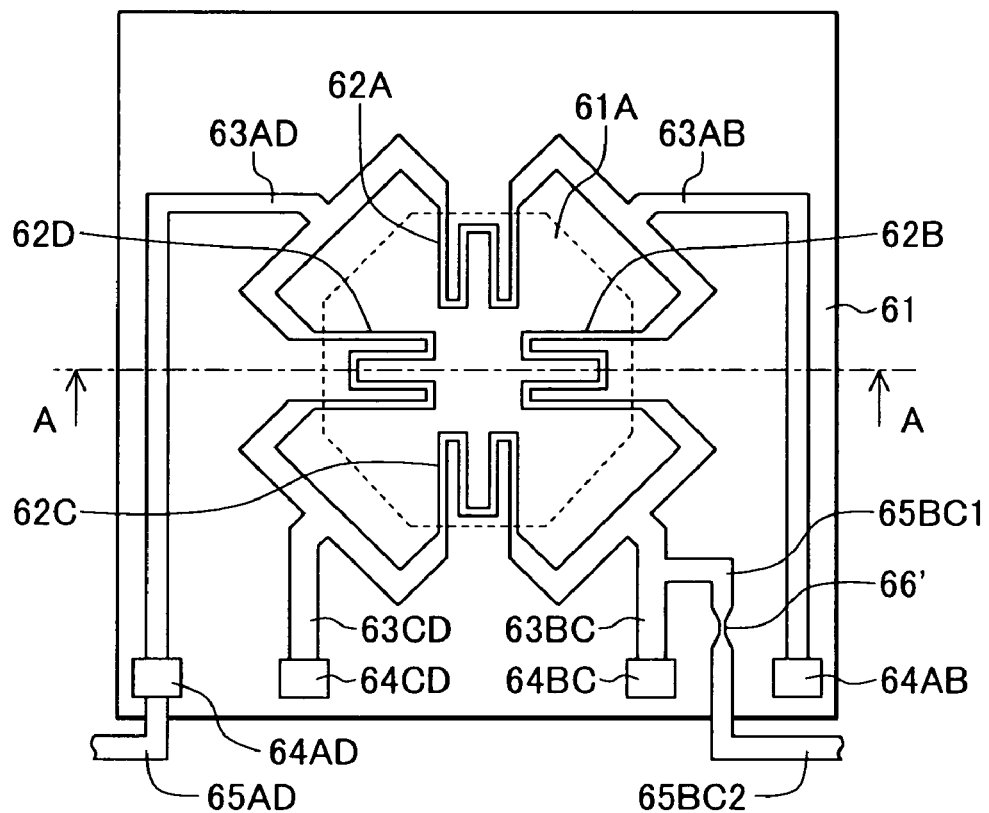
FIG. 23 is an plan view showing a semiconductor type pressure sensor serving as a physical quantity detecting device according to an eighth embodiment of the present invention.
Figure 24:
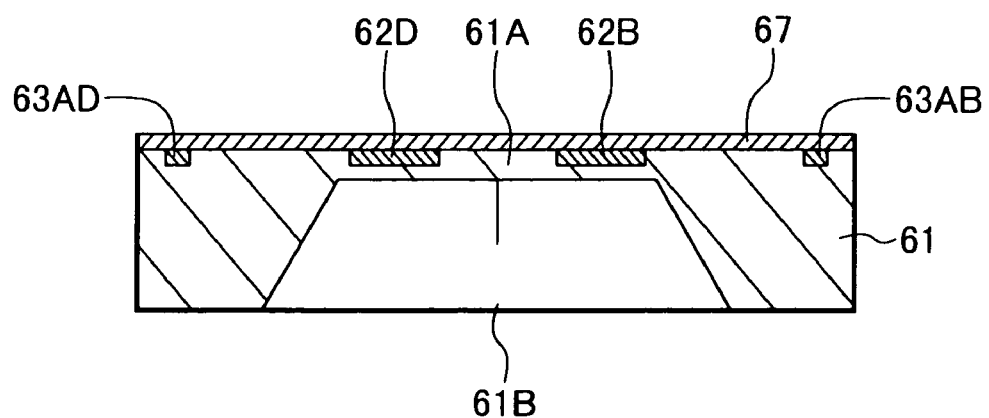
FIG. 24 is a cross-sectional view taken along A—A of FIG. 23.

FIG. 23 is an plan view showing a semiconductor type pressure sensor serving as a physical quantity detecting device according to an eighth embodiment of the present invention, and FIG. 24 is a cross-sectional view taken along A—A of FIG. 23.

As FIG. 23 shows, a pressure sensor 60 is equipped with piezo-resistors 62A, 62B, 62C and 62D formed in a thin-wall portion 61A of a semiconductor substrate 61. The semiconductor substrate 61 is made of, for example, silicon or the like. The piezo-resistors 62 are a resistor in which the semiconductor substrate 62 is doped with impurities. One end portions of the piezo-resistors 62A and 62B are connected through a first lead electrode 63AB to an electrode 64AB. The other end portion of the piezo-resistor 62B and one end portion of the piezo-resistor 62C are connected through a first lead electrode 63BC to an electrode 64BC. The other end portion of the piezo-resistor 62C and one end portion of the piezo-resistor 62D are connected through a first lead electrode 63CD to an electrode 64CD. The other end portions of the piezo-resistor 62D and the piezo-resistor 62A are connected through a first lead electrode 63AD to an electrode 64AD.

In addition, in this embodiment, a second lead conductor 65AD connected to the electrode 64AD extends to an out circumferential portion of the pressure sensor 60. Second lead conductors 65BC1 and 65BC2 connected to the first lead conductor 63BC also extend to the outer circumferential portion of the pressure sensor 60, but a narrow portion 66' is made therebetween. As with the airflow sensors 10 shown in FIG. 6, a plurality of pressure sensors 60 are simultaneously manufactured on a semiconductor wafer. Therefore, the second lead electrode 65AD is connected to an electrode of a pressure sensor adjacent thereto while the second lead electrode 65BC2 is also connected to an electrode of another pressure sensor adjacent thereto, with the result that the piezo-resistors 62 of a plurality of pressure sensors are connected in series.

Still additionally, as FIG. 24 shows, a protective film 67 is formed on a surface of the semiconductor substrate 61 after the formation of the piezo-resistors 62B, 62D, the first lead conductors 63AB, 63AD, and other piezo-resistors, first lead conductors and second lead conductors, not shown, thereon. In addition, through the use of anisotropic etching, a recess section 61B is made in a central area of the rear surface of the semiconductor substrate 61 with respect to the piezo-resistors 62 formation surface, thereby defining a thin-wall portion 61A having a thickness of approximately 0.02 mm.

The pressure sensor 60 itself does not use the heat generating resistor 12H unlike the thermal type airflow sensor 10, and its resistance value does not vary largely, whereas the resistance value varies due to the thermal influence in the actual motor vehicle environments. Accordingly, also in this case, with the aging treatment being made by energizing and heating the piezo-resistors 62 connected in series, the reliability of the pressure sensor 60 is improvable. In particular, this embodiment exhibits an advantage in detecting a pressure under a high temperature. The cutting of the narrow portion 66' after the completion of the aging treatment can eliminate troubles of sensors when mounted.

As described above, according to this embodiment, even for physical quantity detecting devices such as a pressure sensor, the resistance value does not vary even for a long time and the construction becomes simple.

Furthermore, referring to FIGS. 25 and 26, a description will be given hereinbelow of an acceleration sensor serving as a physical quantity detecting device according to a ninth embodiment of the present invention.

Figure 25:
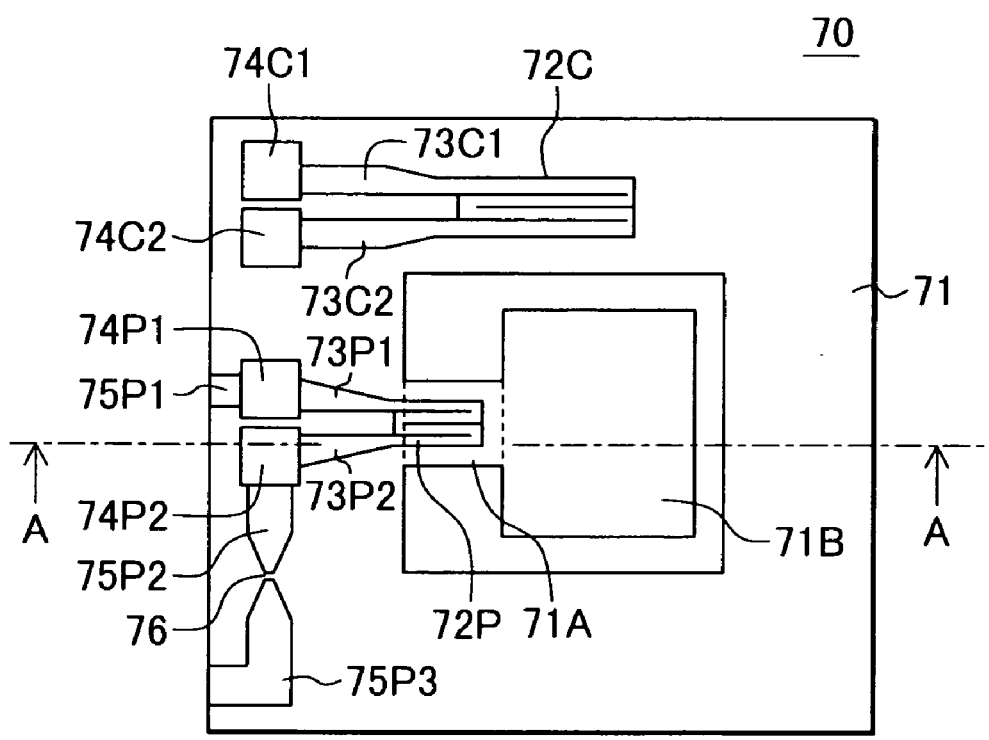
FIG. 25 is an plan view showing an acceleration sensor serving as a physical quantity detecting device according to a ninth embodiment of the present invention.
Figure 26:
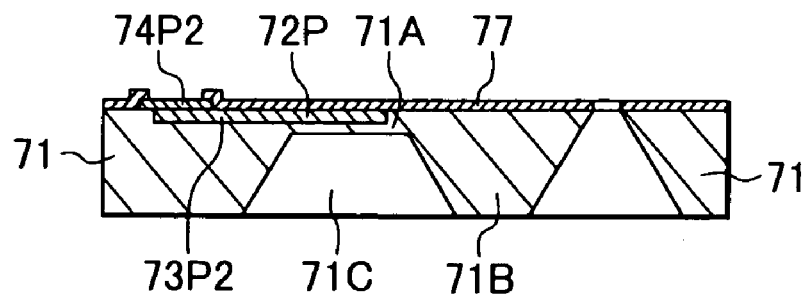
FIG. 26 is a cross-sectional view taken along A—A of FIG. 25.

FIG. 25 is an plan view showing an acceleration sensor serving as a physical quantity detecting device according to a ninth embodiment of the present invention, and FIG. 26 is a cross-sectional view taken along A—A of FIG. 25.

As FIG. 25 shows, an acceleration sensor 70 is equipped with a piezo-resistor 72P formed in a thin-wall portion 71A of a semiconductor substrate 71 and a temperature measuring resistor 72C. An acceleration detecting section 71B is supported on the semiconductor substrate 71 by the thin-wall portion 71A according to a cantilever method, and when the acceleration detecting section 71B is exposed to an acceleration, the thin-wall portion 71A is deflected so that the piezo-resistor 72P can sense the acceleration. For example, the semiconductor substrate 71 is made of silicon or the like. Each of the piezo-resistor 72P and the temperature measuring resistor 72C is a resistor made with the semiconductor substrate 72 being doped with impurities. Both end portions of the piezo-resistor 72P are connected through first lead conductors 73P1 and 73P2 to electrodes 74P1 and 74P2. Both end portions of the temperature measuring resistor 72C are connected through first lead electrodes 73C1 and 73C2 to electrodes 74C1 and 74C2.

In addition, in this embodiment, a second lead conductor 75P1 connected to the electrode 74P1 extends to an outer circumferential portion of the acceleration sensor 70. Also, second lead conductors 75P1 and 75P3 extend to the outer circumferential portion of the acceleration sensor 70, whereas a disconnection portion 76 exists therebetween. As with the airflow sensors 10 shown in FIG. 6, a plurality of acceleration sensors 70 are simultaneously manufactured on a semiconductor wafer. Therefore, the second lead electrode 75P1 is connected to an electrode of a neighboring acceleration sensor while the second lead electrode 75P3 is connected to an electrode of another neighboring acceleration sensor; in consequence, the piezo-resistors 72 of the plurality of acceleration sensors are connected in series. The disconnection portion 76 is in a conduction condition before the aging treatment.

Still additionally, as FIG. 26 shows, a protective film 77 is formed on a surface of the semiconductor substrate 71 after the formation of the piezo-resistor 72P, the first lead conductors 73P2, and a temperature measuring resistor, first lead conductors and second lead conductors, not shown, thereon. In addition, through the use of anisotropic etching, a recess section 71C is made in a central area of the rear surface of the semiconductor substrate 71 with respect to the piezo-resistor 72P formation surface, thereby defining a thin-wall portion 71A having a thickness of approximately 0.01 mm.

The acceleration sensor 70 itself does not use the heat generating resistor 12H unlike the thermal type airflow sensor 10, and its resistance value does not vary largely, whereas the resistance value varies due to the thermal influence in the actual motor vehicle environments. Accordingly, also in this case, with the aging treatment being made by energizing and heating the piezo-resistor 72 connected in series, the reliability of the acceleration sensor 60 is improvable. In particular, this embodiment exhibits an advantage in detecting an acceleration under a high temperature. The narrow portion after the completion of the aging treatment is cut to produce the disconnection portion 76, thus overriding troubles of sensors when mounted.

As described above, according to this embodiment, even for physical quantity detecting devices such as an acceleration sensor, the resistance value does not vary even for a long time and the construction becomes simple.

Although the descriptions of the foregoing embodiments concern, as examples, an airflow sensor, a pressure sensor and an acceleration sensor, the present invention is also applicable to a humidity sensor, gas sensor, temperature sensor or the like having a construction in which a thin-wall portion is made in a semiconductor substrate and a heater is formed in the thin-wall portion, thus providing a physical quantity detecting device with improved reliability.

In addition, as a substrate for the sensor elements, in addition to the above-mentioned substrate in which an extremely thin insulating film is adhered onto a semiconductor substrate or a metallic substrate with a plurality of holes, for example, it is also possible to use a substrate made such that an extremely thin insulating film is adhered onto a ceramic substrate with a plurality of holes to form a thin-wall portion, and further possible to perform the energization aging as well as the above-described embodiments or to perform the dicing after the aging and then divide into the respective sensor elements.

Furthermore, referring to FIG. 27, a description will be given hereinbelow of a configuration of a fuel control system of an internal combustion engine using an airflow sensor serving as a physical quantity detecting device according to a tenth embodiment of the present invention.

Figure 27:
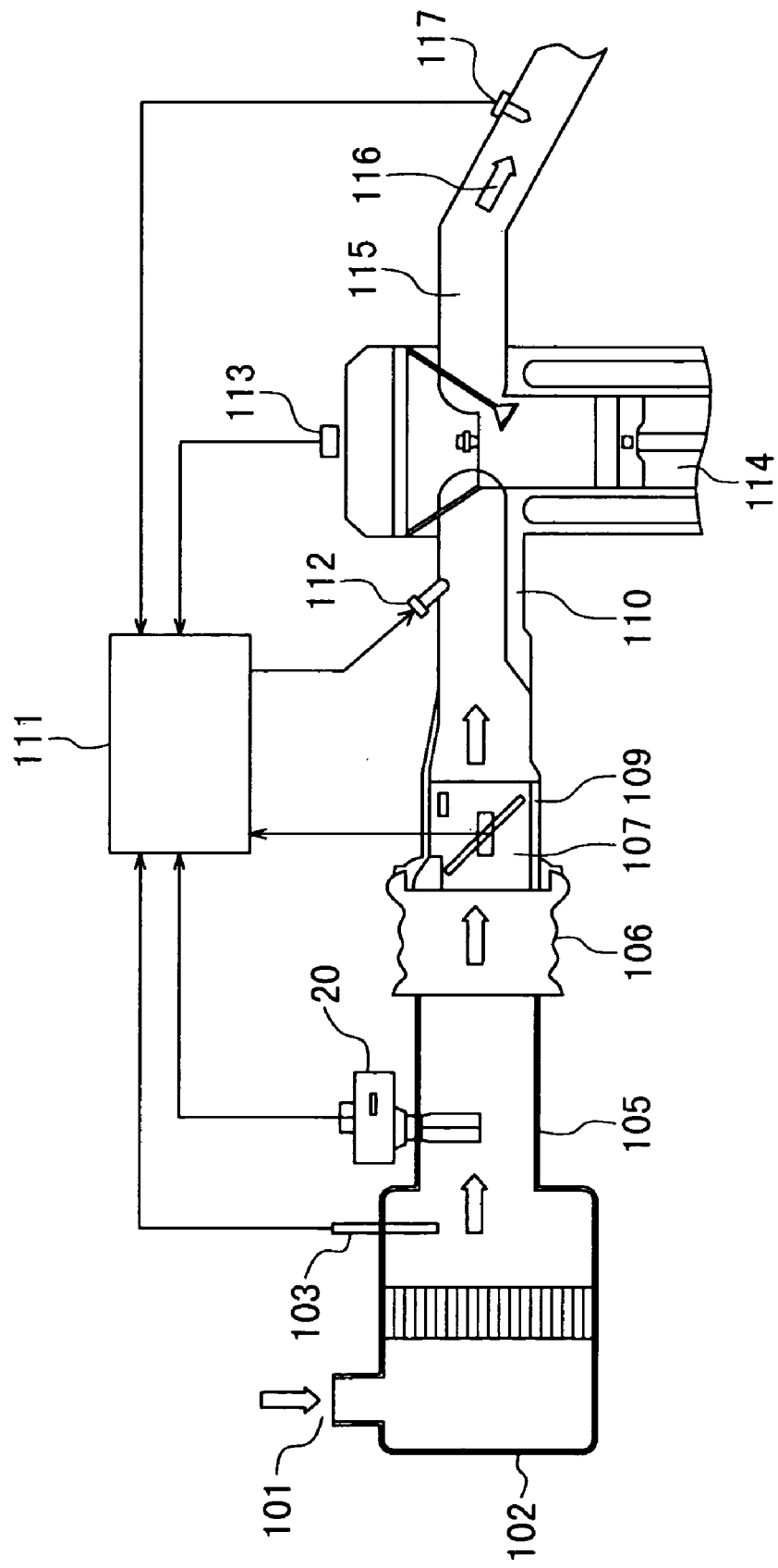
FIG. 27 is an illustration of a configuration of a fuel control system of an internal combustion engine using an airflow sensor serving as a physical quantity detecting device according to a tenth embodiment of the present invention.

FIG. 27 is an illustration of a configuration of a fuel control system of an internal combustion engine using an airflow sensor serving as a physical quantity detecting device according to a tenth embodiment of the present invention.

This embodiment is applicable to an internal combustion engine, more particularly to a gasoline engine. Intake air 101 is introduced through an air cleaner 102, a body 105, a duct 106, a throttle body 109 and an intake manifold 110 into an engine cylinder 114. In the body 105, there are placed an intake air temperature sensor such as a thermistor 103 and the aforesaid airflow meter 20 for respectively detecting an intake air temperature and an air flow rate which in turn, are inputted to an engine control unit 111. In the throttle body 109, there is set a throttle angle sensor 107 for detecting an opening degree of a throttle valve, with the detected throttle angle signal being inputted to the engine control unit 111. In addition, the oxygen concentration in a gas 116 exhausted from an exhaust manifold 115 is detected by an oxygen concentration meter 117, and then fed to the engine control unit 111. The engine speed is detected by a tachometer 113, and then given to the engine control unit 111.

On the basis of these input signals, the engine control unit 111 calculates a fuel injection quantity, and injects the fuel into the intake manifold 110 through the use of an injector 112.

In this case, the airflow meter 20 shows no variation of resistance value irrespective of use for a long time and has a simple structure as mentioned with reference to FIGS. 1 to 22, which improves the reliability of the control of the internal combustion engine.

Incidentally, also for a diesel engine, the basic arrangement is substantially the same, and is also applicable as with this embodiment. That is, the air flow rate is detected by an airflow meter 20 located between an air cleaner 102 of the diesel engine and a manifold 115 thereof, with the detection signal being inputted to the control unit 111.

Moreover, in addition to a system for fuel control, it is also applicable to ignition timing control or motor vehicle control, and likewise the control system reliability is improvable.

As described above, this embodiment can achieve the improvement of the reliability of a motor vehicle control system.

Furthermore, referring to FIG. 28, a description will be given hereinbelow of a configuration of a fuel control system of an internal combustion engine using an airflow sensor serving as a physical quantity detecting device according to an eleventh embodiment of the present invention.

Figure 28:
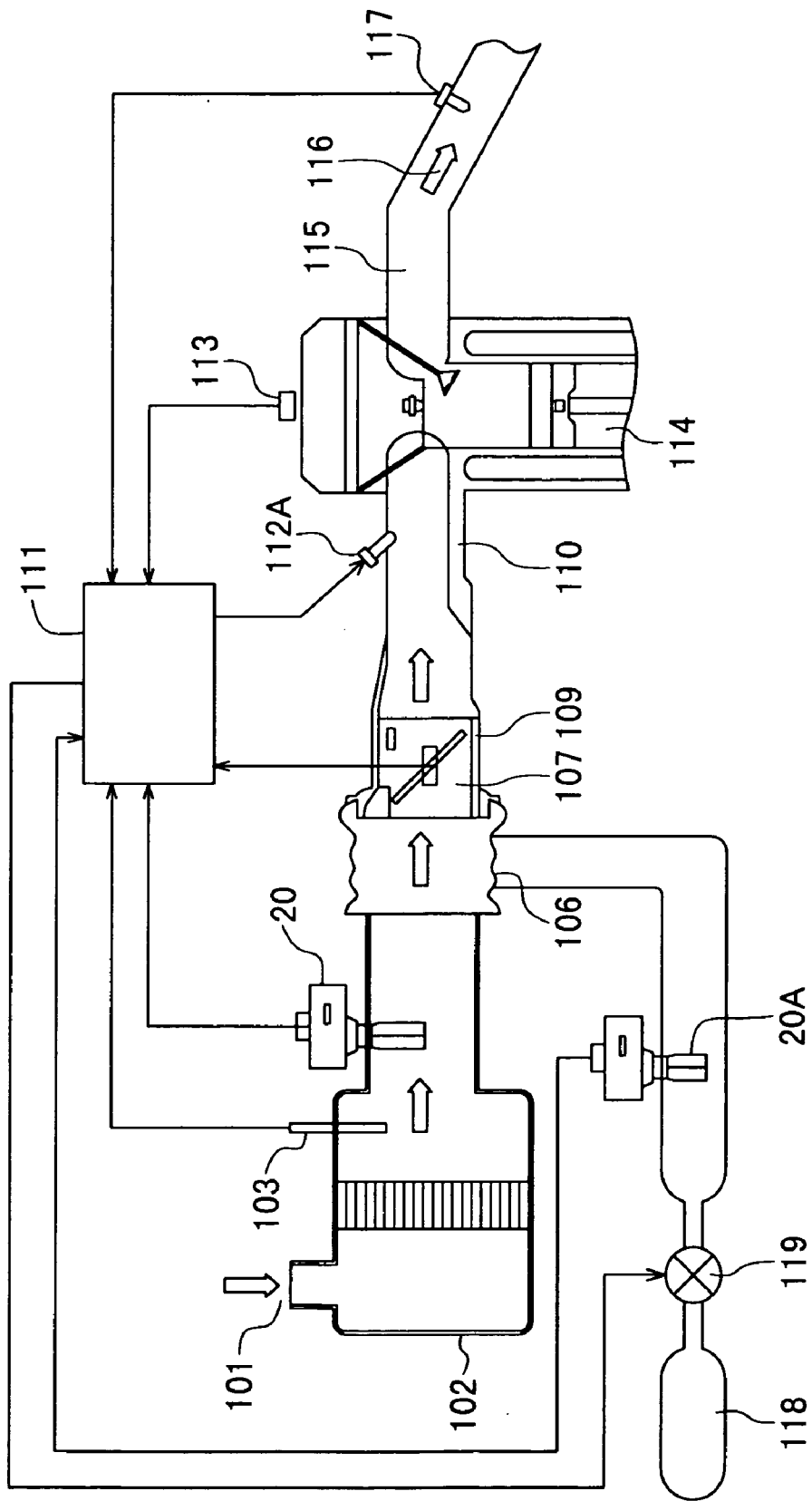
FIG. 28 is an illustration of a configuration of a fuel control system of an internal combustion engine using an airflow sensor serving as a physical quantity detecting device according to an eleventh embodiment of the present invention.

FIG. 28 is an illustration of a configuration of a fuel control system of an internal combustion engine using an airflow sensor serving as a physical quantity detecting device according to an eleventh embodiment of the present invention.

This embodiment is applicable to an internal combustion engine, more particularly to a gas engine. Intake air 101 is introduced through an air cleaner 102, a body 105, a duct 106, a throttle body 109 and an intake manifold 110 into an engine cylinder 114. In the body 105, there are placed an intake air temperature sensor 103 and the aforesaid airflow meter 20 for respectively detecting an intake air temperature and an air flow rate which in turn, are inputted to an engine control unit 111. In the throttle body 109, there is set a throttle angle sensor 107 for detecting an opening degree of a throttle valve, with the detected throttle angle signal being inputted to the engine control unit 111. In addition, the oxygen concentration in a gas 116 exhausted from an exhaust manifold 115 is detected by an oxygen concentration meter 117, and then fed to the engine control unit 111. The engine speed is detected by a tachometer 113, and then given to the engine control unit 111. Still additionally, the flow rate of a gas supplied from a gas tank 118 filled with a CNG (Compressed Natural Gas) is detected by the aforesaid airflow meter 20A and then fed to the engine control unit 111.

At start-up, on the basis of these input signals, the engine control unit 111 calculates a gas injection quantity from an injector 112, and injects the fuel into the intake manifold 110 through the use of the injector 112. In addition, after the start-up, the engine control unit 111 detects a gas flow rate through the use of the airflow meter 20A to control the opening degree of a valve 119 to provide a predetermined gas flow rate.

In this case, the airflow meters 20 and 20A show no variation of resistance value irrespective of use for a long time and has a simple structure as mentioned with reference to FIGS. 1 to 22, thus improving the reliability of the control of the internal combustion engine.

Moreover, in addition to a system for fuel control, it is also applicable to ignition timing control or motor vehicle control, and likewise the control system reliability is improvable.

As described above, this embodiment can achieve the improvement of the reliability of a motor vehicle control system.

Furthermore, referring to FIG. 29, a description will be given hereinbelow of a configuration of a fuel control system of an internal combustion engine using a pressure sensor serving as a physical quantity detecting device according to a twelfth embodiment of the present invention.

Figure 29:
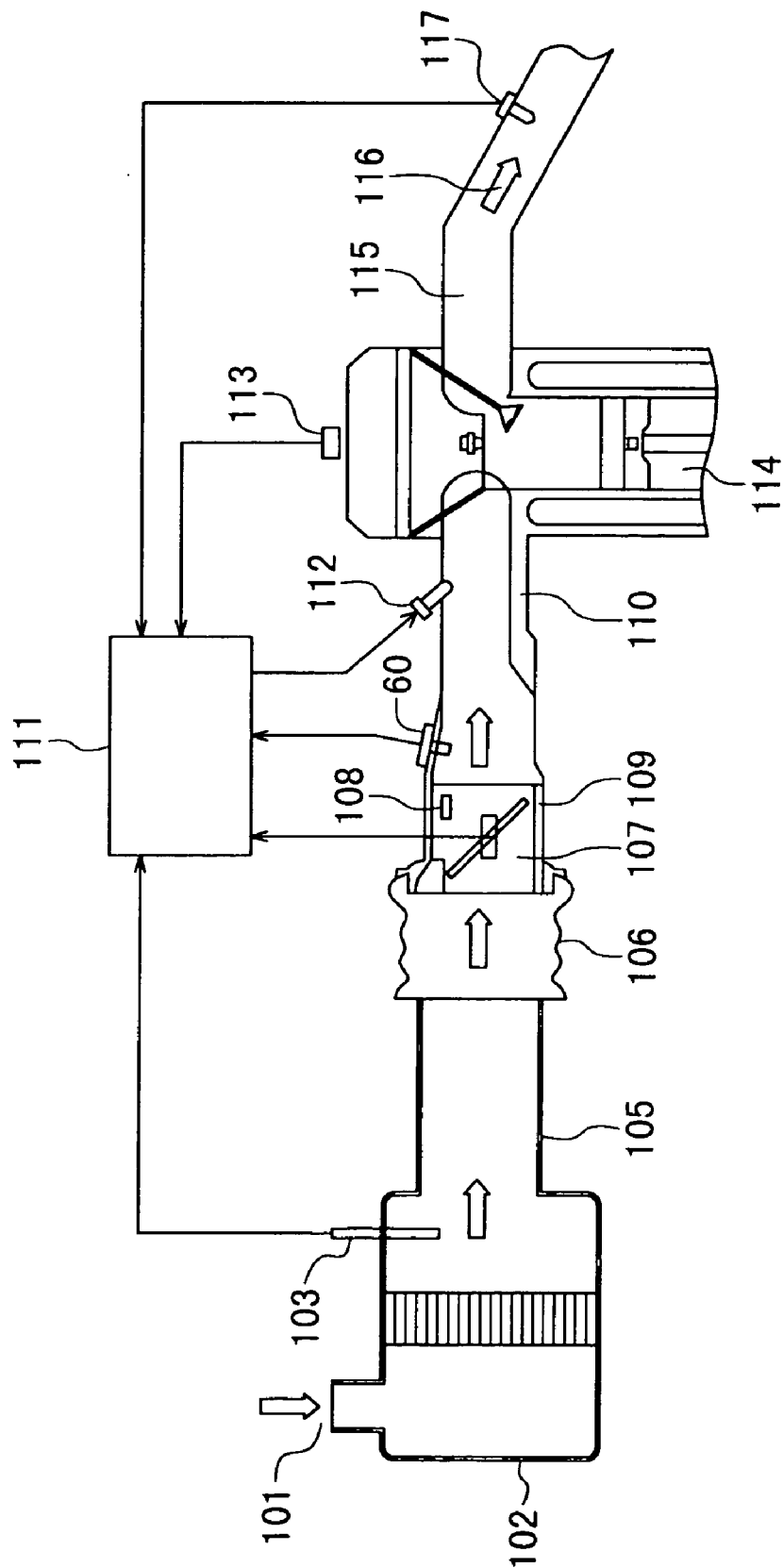
FIG. 29 is an illustration of a configuration of a fuel control system of an internal combustion engine using a pressure sensor serving as a physical quantity detecting device according to a twelfth embodiment of the present invention.

FIG. 29 is an illustration of a configuration of a fuel control system of an internal combustion engine using a pressure sensor serving as a physical quantity detecting device according to a twelfth embodiment of the present invention.

This embodiment is applicable to an internal combustion engine, more particularly to a gasoline engine. Intake air 101 is introduced through an air cleaner 102, a body 105, a duct 106, a throttle body 109 and an intake manifold 110 into an engine cylinder 114. In the body 105, there is placed an intake air temperature sensor 103 for detecting an intake air temperature which in turn, is inputted to an engine control unit 111. In the throttle body 109, there is set a throttle angle sensor 107 for detecting an opening degree of a throttle valve, with the detected throttle angle signal being inputted to the engine control unit 111. In the intake manifold 110, there is placed the aforesaid pressure sensor 60 for detecting an intake pressure, with the detected intake pressure being inputted to the engine control unit 111. In addition, the oxygen concentration in a gas 116 exhausted from an exhaust manifold 115 is detected by an oxygen concentration meter 117, and then fed to the engine control unit 111. The engine speed is detected by a tachometer 113, and then given to the engine control unit 111.

On the basis of these input signals, the engine control unit 111 calculates a fuel injection quantity from an injector 112, and injects the fuel into the intake manifold 110 through the use of the injector 112.

In this case, the pressure sensor 60 shows no variation of resistance value irrespective of use for a long time and has a simple structure as mentioned with reference to FIGS. 23 and 24, thus improving the reliability of the control of the internal combustion engine.

Moreover, in addition to a system for fuel control, it is also applicable to ignition timing control or motor vehicle control, and likewise the control system reliability is improvable.

As described above, this embodiment can achieve the improvement of the reliability of a motor vehicle control system.

Although not shown, the motor vehicle control systems shown in FIGS. 27 to 29 can further include, in addition to the flow rate sensor and the pressure sensor, sensors (detecting devices) such as a gas component sensor, an oxygen concentration sensor, an acceleration sensor, a temperature sensor, a humidity sensor and others for detecting other physical quantities.

INDUSTRIAL APPLICABILITY

According to the present invention, a physical quantity detecting device can be designed to show no variation in resistance value irrespective of use for a long time and to have a simple construction. In addition, it is possible to improve the reliability of a motor vehicle control system using the physical quantity detecting device.

What is claimed is:

1. A physical quantity detecting device comprising a resistor formed on a thin-wall portion of a substrate and electrodes respectively connected through first lead conductors to ends of said resistor and made to detect a physical quantity through the use of said resistor,
    wherein second lead conductors electrically connected to said electrodes and formed on said substrate to extend to an outer circumferential end of said substrate.

2. A physical quantity detecting device according to claim 1, wherein at least one of said second lead conductors has, in the middle thereof, a disconnection portion for making electrical disconnection.

3. A physical quantity detecting device according to claim 1, wherein a second resistor is formed on said substrate and is made of the same material as that of said first-mentioned resistor, with temperature coefficients of resistance of said first-mentioned resistor and said second resistor being different by at least more than 0.25% from each other.

4. A physical quantity detecting device according to claim 3, wherein the material for said first mentioned resistor and said second mentioned resistor is made with one of platinum and polysilicon doped with impurities, and said temperature coefficient of resistance of said first mentioned resistor is lower by more than 0.25% than that of said second mentioned resistor.

5. A physical quantity detecting device according to claim 3, wherein the material for said first mentioned resistor and said second mentioned resistor is made with single-crystal silicon doped with impurities, and said temperature coefficient of resistance of said first mentioned resistor is higher by more than 0.25% than that of said second mentioned resistor.

6. A physical quantity detecting device according to claim 1, wherein said substrate is a semiconductor substrate.

* * * * *